(12) United States Patent
Willey

(10) Patent No.: US 10,408,884 B2
(45) Date of Patent: Sep. 10, 2019

(54) POWER TOOL BATTERY PACK WITH WIRELESS COMMUNICATION

(71) Applicant: TTI (MACAO COMMERCIAL OFFSHORE) LIMITED, Macau (MO)

(72) Inventor: Brent M. Willey, Anderson, SC (US)

(73) Assignee: TTI (MACAO COMMERCIAL OFFSHORE) LIMITED, Macau (MO)

( * ) Notice: Subject to any disclaimer, the term of this patent is extended or adjusted under 35 U.S.C. 154(b) by 192 days.

(21) Appl. No.: 15/461,067

(22) Filed: Mar. 16, 2017

(65) Prior Publication Data

US 2017/0269167 A1    Sep. 21, 2017

Related U.S. Application Data

(60) Provisional application No. 62/309,346, filed on Mar. 16, 2016, provisional application No. 62/309,349, filed on Mar. 16, 2016.

(51) Int. Cl.
*G01R 31/00* (2006.01)
*G01R 31/371* (2019.01)
(Continued)

(52) U.S. Cl.
CPC ....... *G01R 31/371* (2019.01); *G01R 31/3648* (2013.01); *G01R 31/382* (2019.01);
(Continued)

(58) Field of Classification Search
USPC .......................... 324/426–434; 320/124, 125
See application file for complete search history.

(56) References Cited

U.S. PATENT DOCUMENTS 2,288,984 A    7/1942 Willits
4,488,555 A    12/1984 Imran
(Continued)

FOREIGN PATENT DOCUMENTS

EP    0457569 A2    11/1991
EP    1903658 A2    3/2008
(Continued)

OTHER PUBLICATIONS

Australian Patent Office Examination Report for Application No. 2017201788 dated Sep. 21, 2018, 7 pages.
(Continued)

*Primary Examiner* — Vincent Q Nguyen
(74) *Attorney, Agent, or Firm* — Michael Best & Friedrich LLP

(57) ABSTRACT

Trigger pull tracking, charge time estimation, and other features for a power tool battery pack with wireless communication. A battery pack system includes a power tool battery pack and a processor. The battery pack includes a plurality of cells and a voltage sensor connected to the plurality of cells. The processor is in communication with the voltage sensor that detects a voltage across the plurality of cells using the voltage sensor. The processor further converts the voltage across the plurality of cells to a state of charge; determines a charge rate of a charger charging the battery pack; and determines a conversion factor based on the charge rate. The processor then generates a time to full charge of the battery pack based on the state of charge, the charge rate, and the scalar conversion factor. The processor may further generate current traces for the battery pack.

20 Claims, 20 Drawing Sheets

(51) Int. Cl.
*G01R 31/396* (2019.01)
*G01R 31/36* (2019.01)
*H01M 10/42* (2006.01)
*H01M 10/48* (2006.01)
*H02J 7/00* (2006.01)
*G01R 31/382* (2019.01)

(52) U.S. Cl.
CPC ........ *G01R 31/396* (2019.01); *H01M 10/425* (2013.01); *H01M 10/482* (2013.01); *H01M 10/488* (2013.01); *H02J 7/0021* (2013.01); *H02J 7/0047* (2013.01); *H01M 2010/4271* (2013.01); *H01M 2220/30* (2013.01)

(56) References Cited

U.S. PATENT DOCUMENTS

| | | | |
|---|---|---|---|
| 4,536,757 | A | 8/1985 | Ijntema |
| 4,660,027 | A | 4/1987 | Davis |
| 4,916,438 | A | 4/1990 | Collins |
| 4,968,941 | A | 11/1990 | Rogers |
| 5,159,272 | A | 10/1992 | Rao |
| 5,239,286 | A | 8/1993 | Komatsuda |
| 5,250,904 | A | 10/1993 | Salander |
| 5,304,986 | A | 4/1994 | Motegi |
| 5,459,671 | A | 10/1995 | Duley |
| 5,553,478 | A | 9/1996 | Di Troia |
| 5,565,759 | A | 10/1996 | Dunstan |
| 5,608,306 | A | 3/1997 | Rybeck |
| 5,675,234 | A | 10/1997 | Greene |
| 5,683,827 | A | 11/1997 | Yu |
| 5,705,912 | A | 1/1998 | Ichihara |
| 5,789,899 | A | 8/1998 | van Phuoc et al. |
| 5,899,855 | A | 5/1999 | Brown |
| 5,936,534 | A | 8/1999 | Yokota |
| 5,939,990 | A | 8/1999 | Ahn |
| 6,184,656 | B1 | 2/2001 | Karunasiri |
| RE37,281 | E | 7/2001 | Motegi |
| 6,297,615 | B1 | 10/2001 | Crass |
| 6,337,559 | B1 | 1/2002 | Sato |
| 6,344,733 | B1 | 2/2002 | Crass |
| 6,577,104 | B2 | 6/2003 | Sakakibara |
| 6,590,364 | B2 | 7/2003 | Rogers |
| 6,607,041 | B2 | 8/2003 | Suzuki |
| 6,653,843 | B2 | 11/2003 | Whitchurch |
| 6,717,520 | B1 | 4/2004 | Dorenbosch |
| 6,727,678 | B2 | 4/2004 | Yu |
| 6,888,468 | B2 | 5/2005 | Bertness |
| 6,955,864 | B1 | 10/2005 | Vaisnys |
| 7,121,358 | B2 | 10/2006 | Gass |
| 7,357,526 | B2 | 4/2008 | Zeiler |
| 7,492,122 | B2 | 2/2009 | Hofer |
| 7,504,801 | B2 | 3/2009 | Comery |
| 7,508,171 | B2 | 3/2009 | Carrier |
| 7,514,903 | B2 | 4/2009 | Lee |
| 7,574,172 | B2 | 8/2009 | Clark |
| 7,592,773 | B2 | 9/2009 | Pellenc |
| 7,613,590 | B2 | 11/2009 | Brown |
| 7,638,958 | B2 | 12/2009 | Philipp |
| 7,646,173 | B1 | 1/2010 | Coleman |
| 7,714,541 | B2 | 5/2010 | Stamos |
| 7,719,237 | B2 | 5/2010 | Roh |
| 7,817,053 | B2 | 10/2010 | Kusakari |
| 7,868,591 | B2 | 1/2011 | Phillips |
| 7,870,410 | B2 | 1/2011 | Hyatt |
| 7,982,593 | B2 | 7/2011 | Hsu |
| 8,049,636 | B2 | 11/2011 | Buckingham |
| 8,072,341 | B2 | 12/2011 | Sheng |
| 8,082,181 | B2 | 12/2011 | Panasik |
| 8,089,247 | B2 | 1/2012 | Pellenc |
| 8,169,298 | B2 | 5/2012 | Wiesner |
| 8,179,276 | B2 | 5/2012 | Dycus |
| 8,207,741 | B2 | 6/2012 | Kang |
| 8,395,519 | B2 | 3/2013 | Cassidy |
| 8,412,179 | B2 | 4/2013 | Gerold |
| 8,421,433 | B2 | 4/2013 | Vyne |
| 8,421,466 | B2 | 4/2013 | Kang |
| 8,487,778 | B2 | 7/2013 | Kang |
| 8,558,508 | B2 | 10/2013 | Fechalos |
| 8,643,500 | B2 | 2/2014 | Lee |
| 8,657,482 | B2 | 2/2014 | Malackowski |
| 8,664,912 | B2 | 3/2014 | Olsberg |
| 8,847,775 | B2 | 6/2014 | Morin |
| 8,797,173 | B2 | 8/2014 | Kang |
| 8,902,072 | B2 | 12/2014 | Lee |
| 8,928,276 | B2 | 1/2015 | Kesler |
| 8,986,866 | B2 | 3/2015 | Rothkopf |
| 9,018,956 | B2 | 4/2015 | Eguchi |
| 9,046,580 | B2 | 6/2015 | Hermann |
| 9,055,033 | B2 | 6/2015 | Mergener |
| 9,057,210 | B2 | 6/2015 | Dumas |
| 9,083,064 | B2 | 7/2015 | Leport |
| 9,193,053 | B2 | 11/2015 | Rudolph |
| 9,209,642 | B2 | 12/2015 | Cunanan |
| 9,256,988 | B2 | 2/2016 | Wenger |
| 9,297,861 | B2 | 3/2016 | Chang |
| 9,367,062 | B2 | 6/2016 | Volpert |
| 9,700,997 | B2 | 7/2017 | Schlegel et al. |
| 2002/0033267 | A1 | 3/2002 | Schweizer |
| 2002/0149346 | A1 | 10/2002 | Sakakibara |
| 2003/0096158 | A1 | 5/2003 | Takano et al. |
| 2003/0180606 | A1* | 9/2003 | Sasaki ............. H01M 6/50 429/125 |
| 2005/0073282 | A1 | 4/2005 | Carrier |
| 2005/0173142 | A1 | 8/2005 | Cutler |
| 2006/0038572 | A1 | 2/2006 | Philbrook |
| 2006/0043933 | A1 | 3/2006 | Latinis |
| 2006/0087284 | A1 | 4/2006 | Phillips |
| 2006/0119324 | A1 | 6/2006 | Kim |
| 2007/0182576 | A1 | 8/2007 | Proska |
| 2007/0247112 | A1 | 10/2007 | Yu |
| 2008/0079592 | A1 | 4/2008 | Latinis |
| 2009/0251330 | A1 | 10/2009 | Gerold |
| 2010/0096151 | A1 | 4/2010 | Oestling |
| 2010/0217466 | A1 | 8/2010 | Ichikawa |
| 2010/0259211 | A1 | 10/2010 | Yen |
| 2011/0033735 | A1 | 2/2011 | Kinoshita |
| 2011/0234173 | A1 | 9/2011 | Kao et al. |
| 2011/0250477 | A1 | 10/2011 | Yoshida |
| 2012/0116379 | A1 | 5/2012 | Yates |
| 2012/0116381 | A1 | 5/2012 | Houser |
| 2012/0118595 | A1 | 5/2012 | Pellenc |
| 2012/0167721 | A1 | 7/2012 | Fluhrer |
| 2012/0169485 | A1 | 7/2012 | Eckert |
| 2012/0229288 | A1 | 9/2012 | Kim |
| 2012/0251859 | A1 | 10/2012 | Payne |
| 2012/0256752 | A1 | 10/2012 | Musser |
| 2012/0267134 | A1 | 10/2012 | Matthias |
| 2012/0306450 | A1* | 12/2012 | Nakayama ............. G06F 1/263 320/134 |
| 2013/0109375 | A1 | 5/2013 | Zeiler |
| 2013/0127611 | A1 | 5/2013 | Bernstein |
| 2013/0138606 | A1 | 5/2013 | Kahle |
| 2013/0153250 | A1 | 6/2013 | Eckert |
| 2013/0193891 | A1 | 8/2013 | Wood |
| 2013/0277078 | A1 | 10/2013 | Wallgren |
| 2014/0000922 | A1 | 1/2014 | Pellenc |
| 2014/0006295 | A1 | 1/2014 | Zeiler |
| 2014/0025834 | A1 | 1/2014 | Mergener |
| 2014/0038006 | A1 | 2/2014 | Sturm |
| 2014/0070924 | A1 | 3/2014 | Wenger |
| 2014/0077755 | A1 | 3/2014 | Zhang |
| 2014/0107853 | A1 | 4/2014 | Ashinghurst |
| 2014/0119575 | A1 | 5/2014 | Conrad |
| 2014/0127541 | A1 | 5/2014 | Kubota |
| 2014/0145853 | A1 | 5/2014 | Chang |
| 2014/0151079 | A1 | 6/2014 | Furui |
| 2014/0158389 | A1 | 6/2014 | Ito |
| 2014/0159919 | A1 | 6/2014 | Furui |
| 2014/0159920 | A1 | 6/2014 | Furui |
| 2014/0172333 | A1* | 6/2014 | Gopalakrishnan ......... G01R 31/3624 702/63 |
| 2014/0184397 | A1 | 7/2014 | Volpert |

(56) References Cited

U.S. PATENT DOCUMENTS

| | | |
|---|---|---|
| 2014/0225428 A1 | 8/2014 | Campbell |
| 2014/0240125 A1 | 8/2014 | Burch |
| 2014/0262391 A1 | 9/2014 | Eardley |
| 2014/0272498 A1 | 9/2014 | Duncan |
| 2014/0272499 A1 | 9/2014 | Duncan |
| 2014/0273858 A1 | 9/2014 | Panther |
| 2014/0379136 A1 | 12/2014 | Schlegel |
| 2015/0132617 A1 | 5/2015 | Petruzzi |
| 2015/0171485 A1 | 6/2015 | Rawlinson |
| 2015/0198670 A1 | 7/2015 | Thiel |
| 2015/0198674 A1 | 7/2015 | Kroker |
| 2016/0171788 A1 | 6/2016 | Wenger |
| 2016/0226277 A1 | 8/2016 | Wenger et al. |
| 2016/0344230 A1* | 11/2016 | Chan ........................ H02J 7/007 |

FOREIGN PATENT DOCUMENTS

| | | |
|---|---|---|
| EP | 2617529 A2 | 7/2013 |
| EP | 2645117 A1 | 10/2013 |
| EP | 2446286 B1 | 1/2014 |
| EP | 2899844 | 7/2015 |
| EP | 2963765 A1 | 1/2016 |
| WO | WO-9809418 A1 | 3/1998 |
| WO | WO-9909420 A1 | 2/1999 |
| WO | WO-2005053131 A2 | 6/2005 |
| WO | WO-2009000588 A1 | 12/2008 |
| WO | WO-2009124826 | 10/2009 |
| WO | WO-2014008627 A1 | 1/2014 |
| WO | WO-2015061370 A1 | 4/2015 |
| WO | WO-2015113108 A1 | 8/2015 |
| WO | WO-2015136320 A1 | 9/2015 |

OTHER PUBLICATIONS

Australian Patent Office Examination Report for Application No. 2017201788 dated Jan. 30, 2018, 4 pages.

\* cited by examiner

| PACK VOLTAGE (VOLTS) | | SOC |
|---|---|---|
| >21 | 20.600 | N/A |
| 20.599 | 20.500 | 0.92 |
| 20.499 | 20.250 | 0.87 |
| 20.249 | 20.000 | 0.81 |
| 19.999 | 19.750 | 0.76 |
| 19.749 | 19.500 | 0.70 |
| 19.499 | 19.250 | 0.67 |
| 19.249 | 19.000 | 0.62 |
| 18.999 | 18.750 | 0.54 |
| 18.749 | 18.500 | 0.49 |
| 18.499 | 18.250 | 0.40 |
| 18.249 | 18.000 | 0.30 |
| 17.999 | 17.750 | 0.23 |
| 17.749 | 17.500 | 0.19 |
| 17.499 | 17.250 | 0.12 |
| 17.249 | 17.000 | 0.08 |
| 16.999 | 16.750 | 0.05 |
| 16.749 | 16.500 | 0.03 |
| 16.499 | 16.250 | 0.03 |
| 16.249 | 16.000 | 0.02 |
| 15.999 | 15.000 | 0.01 |
| 14.999 | 0.000 | N/A |

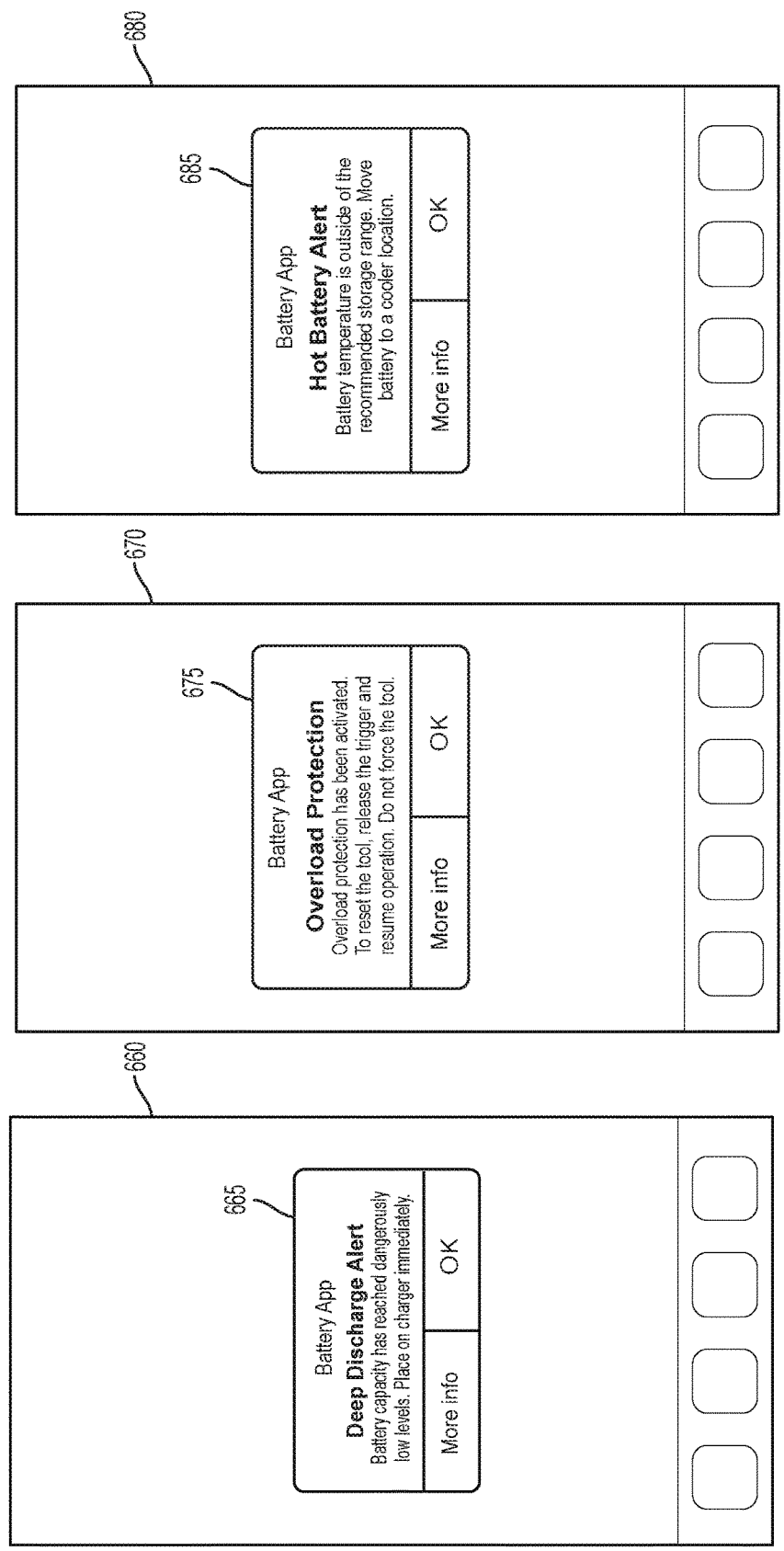

POWER TOOL BATTERY PACK WITH WIRELESS COMMUNICATION

RELATED APPLICATION

This application claims priority to U.S. Provisional Patent Application No. 62/309,349, filed on Mar. 16, 2016, and U.S. Provisional Patent Application No. 62/309,346, filed on Mar. 16, 2016, the entire contents of which are hereby incorporated by reference.

FIELD OF THE INVENTION

The present invention relates to power tool battery packs.

SUMMARY

Power tool battery packs may have various chemistries (e.g., nickel-cadmium or lithium-ion) and various capacities based on the cell type, the number of cells, and other factors. Chargers for power tool battery packs similarly have various characteristics. For example, different chargers may have different charging techniques, charging current levels, and charging voltage levels. Accordingly, the time for a battery pack to be fully charge depends on various factors of the battery pack and the battery charger, limiting the ability to provide accurate estimations of the length of time for a battery pack to be charged.

Some embodiments disclosed herein provide techniques for determining characteristics of battery packs and chargers coupled to the battery packs, and generating time estimates for completing the charging of the battery packs. Because of the additional information obtained regarding the chargers, battery packs, or both, the time estimates have improved accuracy and may be updated in real-time to adjust for changing conditions.

Additionally, some embodiments disclosed herein provide for identifying and analyzing current output from a battery pack during power tool operation, which can provide relevant information for various purposes. For example, the current output can be used to detect potential issues with the battery pack or power tool. Additionally, the current output can be used to identify the battery pack, power tool, or both. In some instances, associating current output by the battery pack with an operation cycle of a power tool (for example, from trigger pull to trigger release) can provide further benefits. Such current output may be referred to as a current trace. The current trace, in contrast to a continuous stream of current data without demarcations, provides a discrete, manageable current data set to analyze and compare against an expected current data set.

In some embodiments, a method is provided for charge time generation for a battery pack configured to be attached to a power tool. The method includes detecting, by a processor, a voltage across a plurality of cells of the battery pack using a voltage sensor. The processor converts the voltage across the plurality of cells to a state of charge, determines a charge rate of a charger charging the battery pack, and determines a conversion factor. The method further includes generating, by the processor, a time to full charge of the battery pack based on the state of charge, the charge rate, and the conversion factor.

In some embodiments, a battery pack system is provided including a battery pack configured to be attached to a power tool. The battery pack system includes a plurality of cells of the battery pack, a voltage sensor of the battery pack connected to the plurality of cells, and a processor. The processor is in communication with the voltage sensor and a memory and is configured to detect a voltage across the plurality of cells using the voltage sensor. The processor is further configured to convert the voltage across the plurality of cells to a state of charge; determine a charge rate of a charger charging the battery pack; and determine a conversion factor based on the charge rate. The processor then generates a time to full charge of the battery pack based on the state of charge, the charge rate, and the scalar conversion factor.

In some embodiments, a method is provided for monitoring a battery pack configured to be attached to a power. The method includes detecting, by a processor of the battery pack, that a trigger of the power tool is activated. The method further includes detecting, by a current sensor connected to a plurality of cells of the battery pack, a current output of the plurality of cells. The processor of the battery pack stores, in a memory of the battery pack, the current output until the trigger is released to form a current trace. The processor further determines that the trigger is released. In some embodiments of the method, the processor also determines whether the current output deviates from an expected current output stored in the memory. The processor then generates an alert in response to the processor determining that the current output deviates from the expected current output.

In some embodiments, a battery pack system is provided including a battery pack configured to be attached to a power tool. The battery pack system includes a plurality of cells of the battery pack, a current sensor connected to a plurality of cells of the battery pack, and a processor. The processor is configured to detect that a trigger of the power tool is activated. The processor further detects, by the current sensor connected to a plurality of cells of the battery pack, a current output of the plurality of cells. The processor of the battery pack stores, in a memory of the battery pack, the current output until the trigger is released to form a current trace. The processor further determines that the trigger is released. In some embodiments, the processor also determines whether the current output deviates from an expected current output stored in the memory. The processor then generates an alert in response to the processor determining that the current output deviates from the expected current output.

BRIEF DESCRIPTION OF THE DRAWINGS

FIG. 5 illustrates an exemplary look up table in accordance with some embodiments.

FIGS. 8 and 9 illustrate another user interface of an application in accordance with some embodiments.

FIG. 10 illustrates another user interface of an application in accordance with some embodiments.

FIG. 11 illustrates another user interface of an application in accordance with some embodiments.

FIG. 12 illustrates another user interface of an application in accordance with some embodiments.

DETAILED DESCRIPTION

Figure 1:
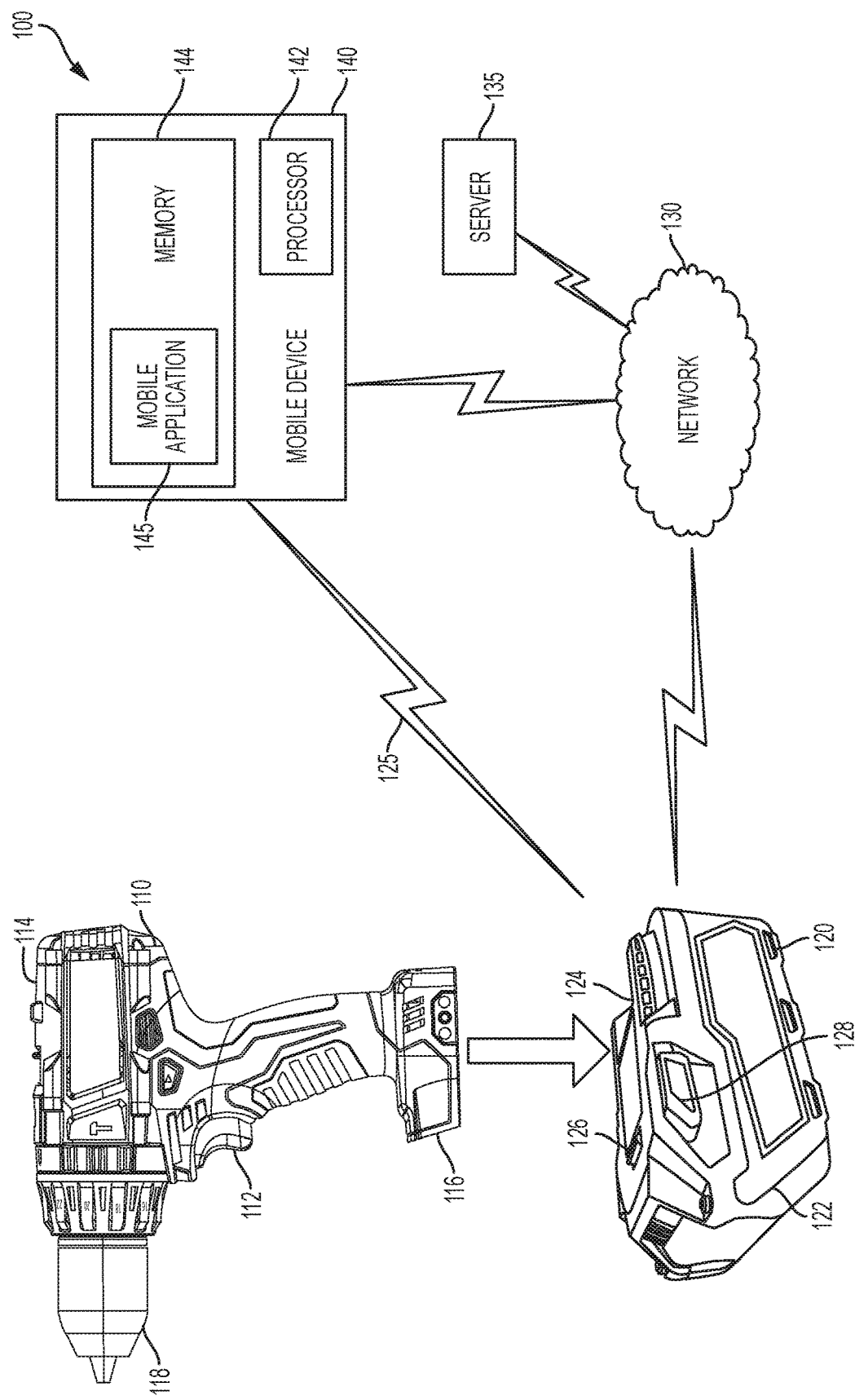
FIG. 1 illustrates a system for communication between a battery pack and a mobile device.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Further, it is to be understood that such terms as "forward", "rearward", "left", "right", "upward" and "downward", etc., are words of convenience and are not to be construed as limiting terms.

It should be noted that a plurality of hardware and software based devices, as well as a plurality of different structural components may be utilized to implement aspects of the invention. Furthermore, specific configurations described or illustrated in the drawings are intended to exemplify independent embodiments of the invention and that other alternative configurations are possible. The terms "controller", "processor", "central processing unit" and "CPU" are interchangeable unless otherwise stated. Where the terms "controller", "processor", "central processing unit" or "CPU" are used as identifying a unit performing specific functions, it should be understood that, unless otherwise stated, those functions can be carried out by a single processor or multiple processors arranged in any form, including parallel processors, serial processors, tandem processors or cloud processing/cloud computing configurations.

As should also be apparent to one of ordinary skill in the art, the systems shown in the figures are models of what actual systems might be like. Many of the modules and logical structures described are capable of being implemented in software executed by a microprocessor or a similar device or of being implemented in hardware using a variety of components including, for example, application specific integrated circuits ("ASICs"). Terms like "controller" and "module" may include or refer to both hardware and/or software. Furthermore, throughout the specification, if capitalized terms are used, such terms are used to conform to common practices and to help correlate the description with the coding examples, equations, and/or drawings. However, no specific meaning is implied or should be inferred simply due to the use of capitalization. Thus, the claims should not be limited to the specific examples or terminology or to any specific hardware or software implementation or combination of software or hardware.

FIG. 1 illustrates a system 100 (e.g., a battery pack system) for communication between a battery pack and a mobile device. In the example illustrated, the system 100 includes a power tool 110, a battery pack 120, a network 130 and a mobile device 140. As shown, the power tool 110 includes a trigger 112, a housing 114, a battery interface 116, and an output unit 118. The power tool 110 communicates with the battery pack 120 over a wired connection (e.g., over terminals that make contact upon coupling the battery pack 120 to the power tool 110). The power tool 110 receives electrical power from the battery pack 120 over the terminals as well. The power tool 110 communicates data relating to the health and functioning of the power tool 110 to the battery pack 120 over the wired connection.

In some embodiments, a dedicated terminal is provided on the battery pack 120 and the power tool 110 for data communication (rather that power transfer) between the battery pack 120 and the power tool 110, and separate power terminals are provided for providing power from the battery pack 120 to the power tool 110. The terminals of the battery pack and power tool are described in further detail with respect to FIGS. 21-22.

As shown in FIG. 1, the battery pack 120 includes a housing 122, a tool interface 124, and a latch 126 controlled by actuator 128 to selectively latch the tool interface 124 to the battery interface 116. The battery pack 120 further includes a plurality of cells arranged in a series, parallel or series-parallel combination. The battery pack 120 communicates data pertaining to the power tool 110 and the battery pack 120 with the mobile device 140. The battery pack 120 may communicate directly with the mobile device 140 over a wireless communication network 125 such as Bluetooth®, Wi-Fi™, and the like. The battery pack 120 may also communicate with the mobile device 140 indirectly through the network 130. The network 130 is a wide area network such as the Internet and the like. In some embodiments, the network 130 is coupled to a server 135, which may be an application server. The battery pack 120 and the mobile device 140 are operable to communicate with the server 135 via the network 130.

The mobile device 140 includes a mobile application 145, which is an application designed for a mobile operating system for use on the mobile device 140. The mobile device 140 is, for example, a mobile phone, tablet or personal computer. The mobile device 140 may include a processor 142 and a memory 144, among other components. The memory 144 may store the mobile application 145 and the processor 142 executes the mobile application 145 to enable the mobile device 140 to carry out the functionality of the mobile application 145 described herein. The mobile application 145 may communicate with the battery pack 120 over a connection between the mobile device 140 and the battery pack 120. The mobile application 145 may include a graphical user interface in that, execution of the mobile application 145 by the processor 142 may generate a graphical user interface on a display (not shown) of the mobile device 140. The mobile device 140 may convey information to a user through display on the graphical user interface and may receive user input via the graphical user interface (e.g., via a touch screen or hard keys of the mobile device). It should be understood that FIG. 1 illustrates only one exemplary embodiment of the system 100 and that the system 100 may include more or less components and may perform additional functions than described herein.

Figure 2A:
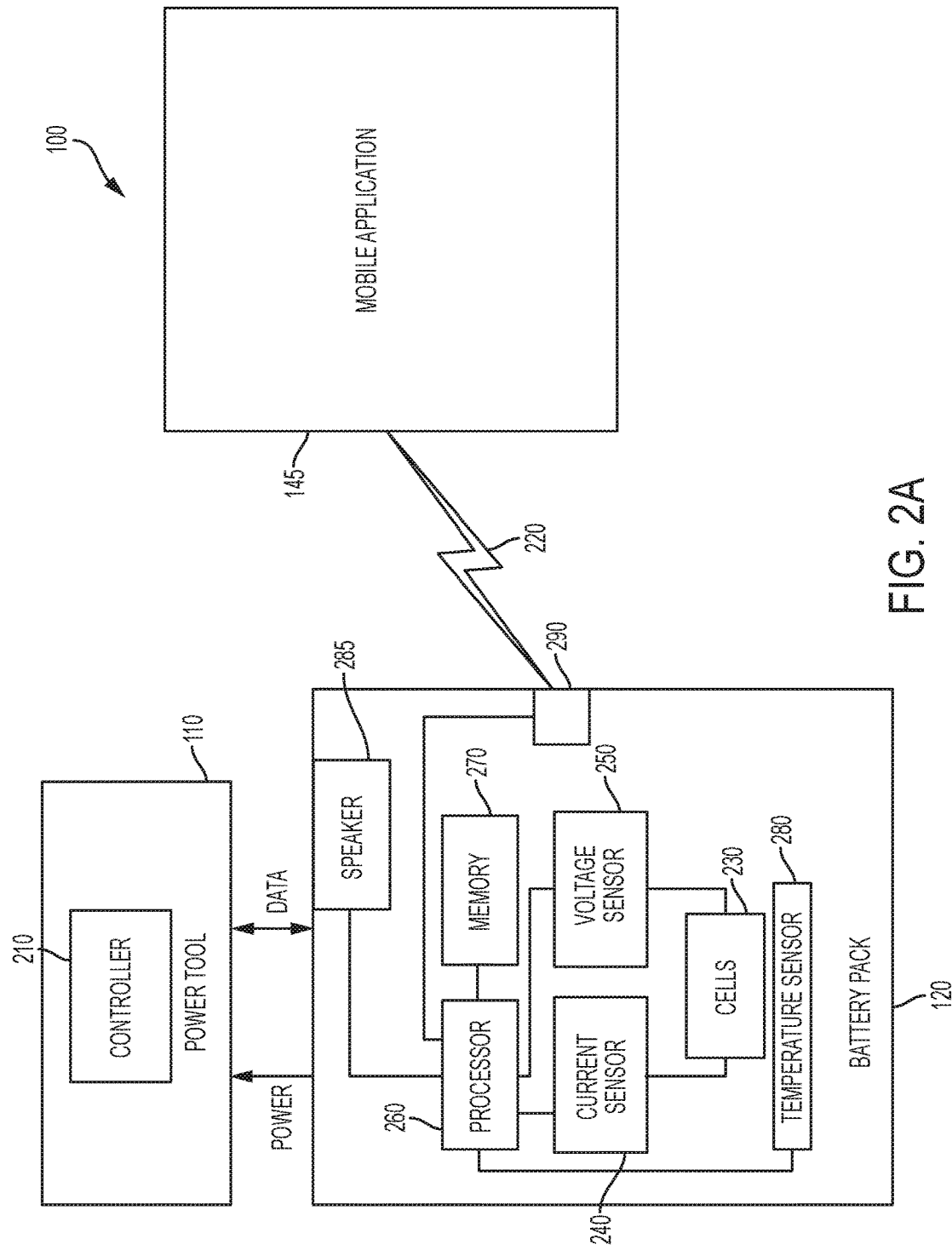
FIG. 2A illustrates a block diagram of the system of FIG. 1.
Figure 2B:
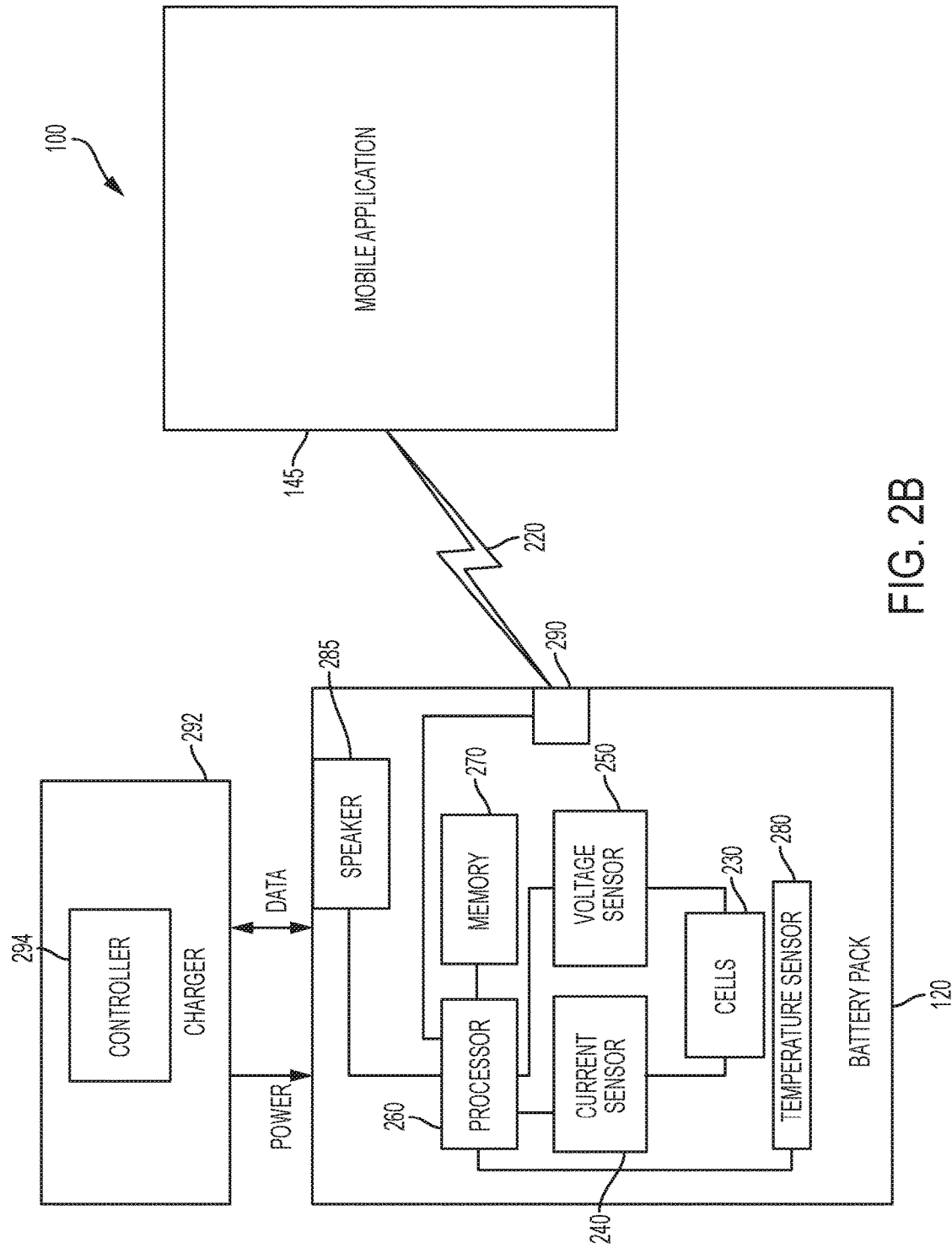
FIG. 2B illustrates a block diagram of the system of FIG. 1 including a charger.

FIGS. 2A and 2B illustrate block diagrams of portions of the system 100 of FIG. 1. In the example illustrated in FIG. 2A, the power tool 110 includes a controller 210. The controller 210 includes an electronic processor and memory storing instructions that are executed by the electronic processor to carry out the functionality of the controller 210 described herein. For example, the controller 210 controls the functions of the power tool 110 and enables communication between the power tool 110 and the battery pack 120. The power tool 110 further includes a motor (not shown) within the housing 114 that is controlled by the controller 210 in response to user input (e.g., pull of the trigger 112) to drive the output unit 118. The battery pack 120 communicates with the mobile application 145 over a communication network 220. The communication network 220 may include the wireless communication network 125 and/or network 130.

The battery pack 120 includes cells 230, a current sensor 240 a voltage sensor 250, a processor 260, a memory 270, a temperature sensor 280, a speaker 285 and a wireless communication circuit 290. The cells 230 may be arranged in series, parallel, or series-parallel combination. The current sensor 240 is electrically connected to the cells 230 and detects a current flowing through the cells 230. The voltage sensor 250 is electrically connected to the cells 230 and detects a voltage across the terminals of the cells 230. The temperature sensor 280 is, for example, a thermistor, and detects a temperature of the cells 230. The wireless communication circuit 290 facilitates communication between the battery pack 120 and external devices over the communication network 220.

The processor 260, which is an electronic processor, is electrically connected to the current sensor 240, the voltage sensor 250, the memory 270, the temperature sensor 280, and the wireless communication circuit 290. The processor 260 monitors the current and voltage of the cells 230 detected by the current sensor 240 and the voltage sensor 250. The memory 270 may include, for example, a program storage area and a data storage area. The memory 270 stores executable instructions that when executed by the processor 260, cause the battery pack 120 to perform the functions described herein. The memory 270 also stores certain other information regarding the battery pack 120, such as a battery pack identifier (ID), expected current output, various voltage, current, and temperature thresholds, and the like. The memory 270 may also store certain tracking information as described herein.

In the example illustrated in FIG. 2B, the battery pack 120 is coupled to a charger 292 that includes a controller 294. The controller 294 includes an electronic processor and memory storing instructions that are executed by the electronic processor to carry out the functionality of the controller 294 described herein. For example, the controller 294 controls the functions of the charger 292 and enables communication between the charger 292 and the battery pack 120. The charger 292 further includes a charging circuit (not shown) within a charger housing that is controlled by the controller 294 to provide charging current to the battery pack 120 to charge the cells 230. The remaining elements of FIG. 2B having the same numbers as elements in FIG. 2A are configured and function similarly to the like-numbered elements of FIG. 2A; accordingly, further description is not provided for these elements.

Figure 3:
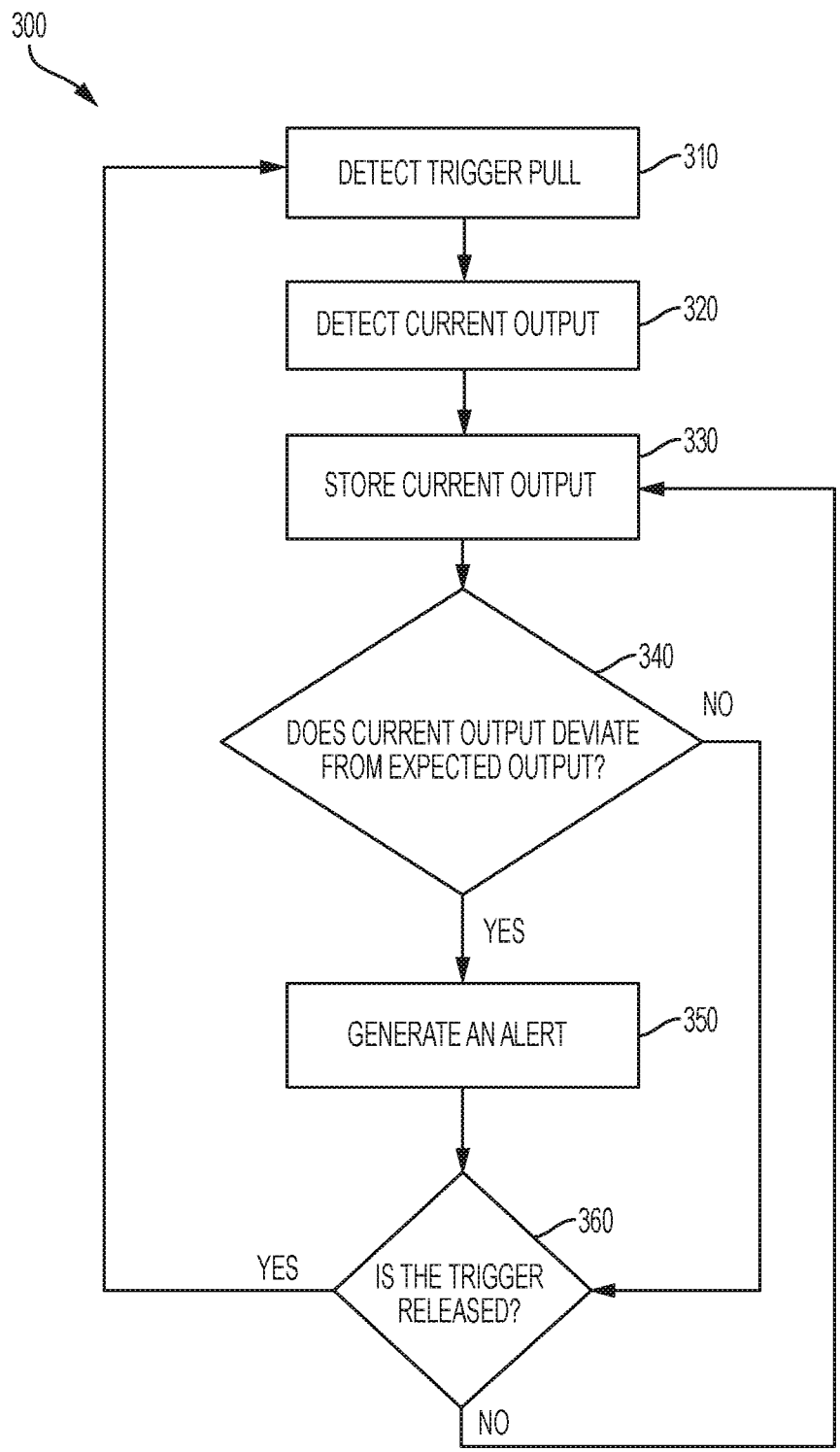
FIG. 3 illustrates a flowchart of a method for trigger pull tracking.

FIG. 3 is a flowchart illustrating an exemplary method 300 for trigger pull tracking. As illustrated in FIG. 3, the processor 260 detects that the trigger 112 (or actuation mechanism) of the power tool 110 is activated (for example, pulled) (at step 310). In some embodiments, the processor 260 determines that the trigger 112 of the power tool 110 is pulled when the battery pack 120 determines that current is flowing through the cells 230. The processor 260 determines that a current is flowing through the cells 230 when the current sensor 240 detects a current in the cells 230. In some embodiments, the battery pack 120 may receive a signal from the power tool 110 that the trigger 112 is pulled.

At step 320, the processor 260 detects a current output of the cells 230. The processor 260 receives a signal from the current sensor 240 indicating the amount of current being drawn by the power tool 110. At step 330, the processor 260 stores the current output in the memory 270. At step 340, the processor 260 determines whether the current output deviates from expected current output stored in the memory 270.

When the processor 260 determines that the current output deviates from the expected current output, the processor 260 generates an alert (at step 350). This alert may be communicated to the mobile application 145 (e.g., via the communication network 220). For example, the alert may be displayed by the mobile application 145 (e.g. on a graphical user interface of the mobile application 145 on a display of the mobile device 140). When the processor 260 determines that the current output is within a range (e.g., a predetermined amount or percentage) of the expected current output (step 340) or after generating an alert in step 350, the processor 260 proceeds to step 360.

At step 360, the processor 260 determines whether the trigger 112 of the power tool 110 is released. As described above, the processor 260 may determine that the trigger 112 is released based on the current output (e.g., being reduced to zero) and/or based on a signal received from the power tool 110 indicating release of the trigger 112. When the processor 260 determines that the trigger is still pulled (i.e., not released), the processor 260 continues to step 320 to continuously track the current output of the battery pack 120. When the processor 260 determines that the trigger is released, the processor 260 continues to step 310 to detect the next trigger pull of the power tool 110.

In some embodiments, the battery pack 120 may detect other attributes of the power tool 110 or the battery pack 120 when the trigger is pulled (e.g., voltage across the cells 230, power output, torque, and the like). Based on the repeated execution of steps 320 and 330, after the trigger is released, the current drawn by the power tool 110 over the course of the trigger pull is stored in the memory 270. Accordingly, the current output may be continuously detected and stored in the memory 270 from trigger activation to trigger release. This collection of current data for a trigger pull may be referred to as a current trace. A current trace may be captured for each trigger pull and stored in the memory 270 as an individually identifiable and retrievable trace (e.g., trace 1, trace 2, . . . , trace N). In some embodiments, the current trace may be requested from the mobile application 145. The processor 260 sends the current trace data in response to receiving a request from the mobile application 145. The mobile application 145 may display the current trace in a graphical or numerical form on a user interface of the mobile device 140.

In some embodiments, steps 340 and 350 are bypassed in the method 300 and the method 300 is used to generate current traces without detecting deviations from expected current output and without generating alerts.

In some embodiments, the mobile application 145 may receive and compare a current trace obtained via the method 300, with or without steps 340 and 350, with predetermined current traces stored in a current trace repository (for example, on the server 135 or the memory 144). The current traces stored in the current trace repository may each be associated with a particular battery pack, power tool, or combination of battery pack and power tool, and may have current data generated from testing. The mobile application 145 is operable to determine that one of the predetermined current traces matches the current trace obtained via the method 300, and, in turn, determine an associated device associated with the predetermined current trace (e.g., the associated battery pack, power tool, or combination of battery pack and power tool). For example, the mobile application 145 may consider a captured current trace to match a predetermined current trace based on a comparison of several discrete points of the traces (for example, at several predetermined points in time along each trace). If the comparison indicates that the points of the traces deviate less than a predetermined amount or percentage, the traces may be determined to match one another. The mobile application 145 uses different techniques to determine whether traces match in some embodiments. Regardless of the technique used to determine a match, the mobile application 145 may display on the mobile device 140 the associated device associated with the predetermined current trace that matched the current trace. Thus, the mobile application 145 may identify and display the type of power tool 110 (e.g., impact driver, hammer drill, reciprocating saw, or circular saw) to which the battery pack 120 is coupled based on the current trace received from the battery pack 120.

Figure 4:
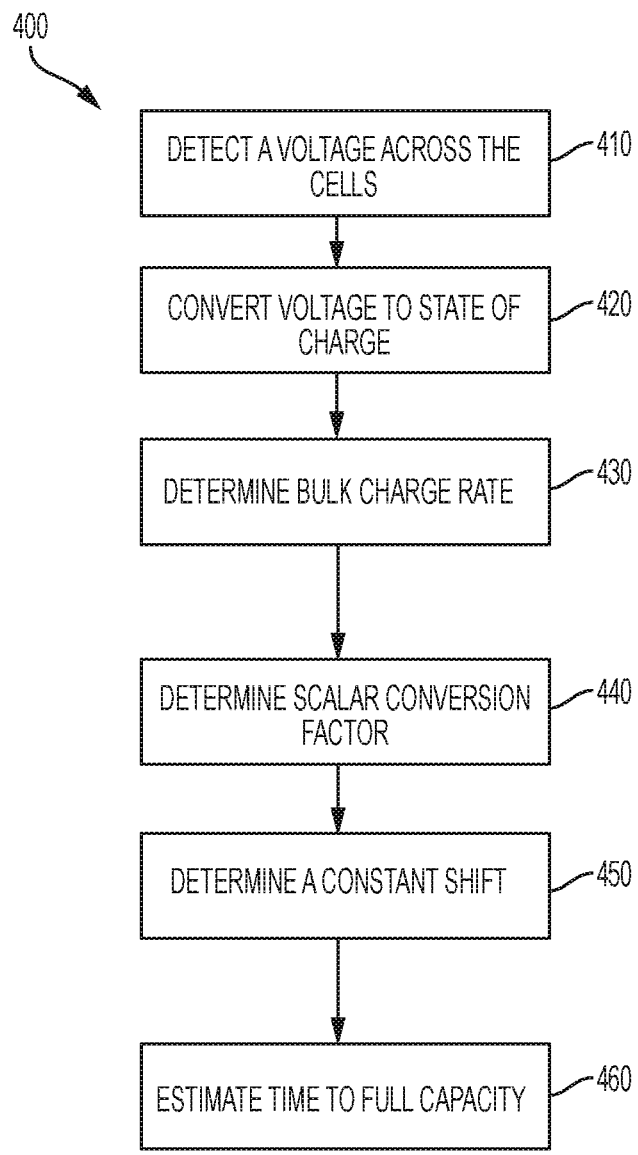
FIG. 4 illustrates a flowchart of a method for battery charge time estimation.

FIG. 4 is a flowchart illustrating an exemplary method 400 for charge time estimation. The method 400 may be executed by an electronic processor, such as the processor 260 or the processor 142. As illustrated in FIG. 4, the processor 260 of the battery pack 120 detects a voltage across the cells 230 (at step 410). For example, the processor 260 detects the voltage using the voltage sensor 250. In some embodiments of the method 400, the processor 142 then detects the voltage in response to receipt of the detected voltage from the processor 260 communicated over the communication network 220. In some embodiments, the battery pack 120 may detect the voltage prior to the charging of the battery pack 120. At step 420, the processor (e.g., the processor 260 or the processor 142) converts the detected voltage to a state of charge (SOC) of the battery pack 120. A look-up table stored in a memory coupled to the processor may be used to determine the SOC corresponding to the voltage detected. The look-up table may assign a SOC value for each range of voltage. An example of such a look-up table is shown in FIG. 5.

Figure 6:
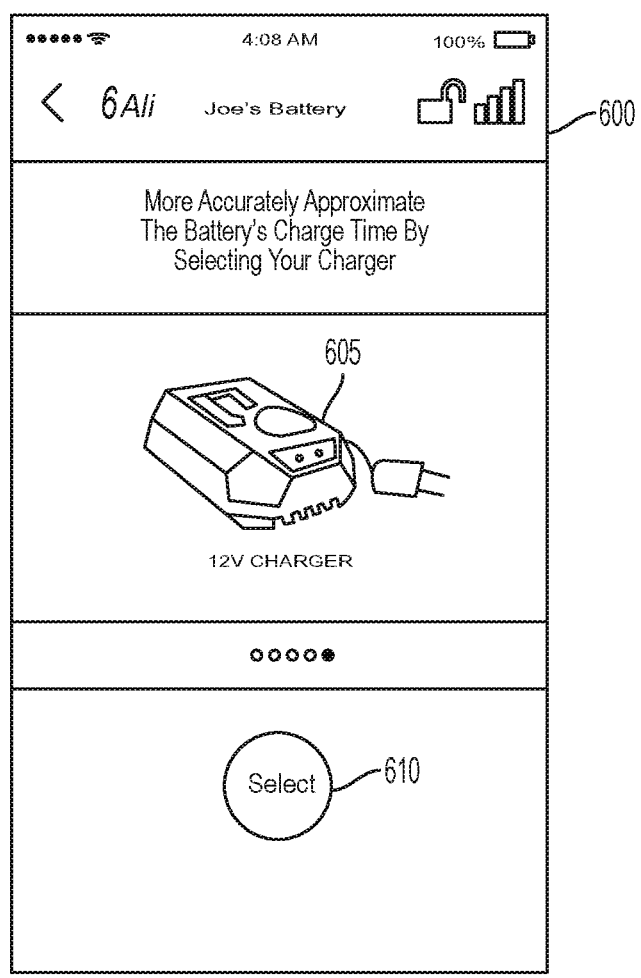
FIG. 6 illustrates a user interface of an application in accordance with some embodiments.

At step 430, the processor (e.g., the processor 260 or the processor 142) determines a charge rate, which may be a bulk charge rate (I), of a charger (e.g., the charger 292) used to charge the battery pack 120. Many different chargers are available to charge the battery pack 120. Bulk charge rate varies depending on the type of charger used. Step 430 may include the mobile device 140 receiving an input from a user (e.g., via a graphical user interface of the mobile application 145) indicating the charger being used to charge the battery pack 120. The user may be prompted to select the charger on a user interface of the mobile application 145. An example of a user interface 600 of the mobile application 145 prompting a user to select a charger is illustrated in FIG. 6. With reference to the user interface 600, the user may swipe left or right on a touch screen of the mobile device 140 illustrating the user interface 600 to cycle between chargers, such as the charger 605, and then indicate a selection of a depicted charger by touching the select key 610. A default value for bulk charge rate may be stored in the memory for instances where a charger being used is not available for selection. The default value may be, for example, an average of the bulk charge rates of all the compatible chargers.

At step 440, the processor (e.g., the processor 260 or the processor 142) determines a conversion factor, which may be a scalar conversion factor (B). The scalar conversion factor may be determined by the processor using the formula $$B = \frac{(C*60)}{I},$$

where C is the capacity (maximum voltage) of the battery. This formula allows the estimated charge time to be determined in terms of minutes. A different value other than 60 may be used to determine the estimated charge time in other time units (for example, seconds, hours, and the like). At step 450, the processor (e.g., the processor 260 or the processor 142) determines a constant shift. A constant shift may be determined based on a generic estimation of taper charge time and any other error manifested. For example, the constant shift may be determined and stored in the memory 270 or a memory of the mobile device 140 during manufacture or upon software installation. In some embodiments, the constant shift may be determined based on an error rate detected in charge monitoring simulation run during manufacturing.

At step 460, the processor (e.g., the processor 260 or the processor 142) estimates time to full capacity or full charge of the battery pack 120. In other words, the processor generates a time to full capacity or full charge of the battery pack 120. The time to full capacity may be estimated using the formula Time=(1−SOC)*B+Constant Shift. In some embodiments, the estimate may be updated periodically, such as every few time intervals (for example, every minute). The processor may store in a memory (e.g., the memory 270 or 144) or output the generated estimate of time in step 460. For example, the processor 260 may output the generated estimate of time to the mobile application 145 for display to a user (see, e.g., FIGS. 7 and 8). Alternatively or additionally, the processor 142 may display the generated estimate of time on the graphical user interface of the mobile application 145 on the display of the mobile device 140 (see, e.g., FIGS. 7 and 8).

In some embodiments, the battery pack 120 may include the temperature sensor 280 (e.g., a thermistor). The processor 260 may determine, based on the temperature of the cells 230 detected and output by the temperature sensor 280, when the cells 230 exceeds a first predetermined threshold or falls below a second predetermined threshold. In other words, the processor 260 may determine whether the temperature of the cells 230 is within a predetermined temperature range. The processor 260 may suspend method 400 and estimation of charge time upon detecting that the temperature of the cells 230 is too high or too low (i.e., outside of the temperature range) and generate a signal indicative of the temperature condition to the mobile application 145. The mobile application 145 may alert a user to remove the battery pack 120 from the charger to alleviate the temperature condition. The method 400 may resume estimation of charge time upon detecting that the temperature of the cells 230 has returned to acceptable ranges.

In some embodiments, the mobile application 145 may not receive an input indicating the charger that is being used to charge the battery pack 120. The battery pack 120 may, in turn, determine the charger being used based on detecting a charging profile (e.g., by detecting a normalized voltage rise). The battery pack 120, first, records a voltage ($V_{r0}$) across the cells 230. The battery pack 120 also records the voltage ($V_{r0+240}$) across the cells 230 a predetermined time period (e.g., 240 seconds) after the first recording. The battery pack 120 determines a normalized voltage rise (Norm) using the formula Norm=$(V_{r0+240}+V_{r0})$*N, where N is a normalization factor of the battery pack 120. The normalization factor is a factor unique to each battery pack 120 and may be determined during a manufacturing or design process. The normalization factor may be stored in the memory 270 or on a server accessible to the mobile application 145. In some embodiments, the normalization factor may be proportional to the number of parallel cell strings in the battery pack 120. The normalized voltage rise may correspond to a particular charger type. For example, the normalized voltage rise may be used as an index into a lookup table (e.g., stored in the memory 270 or the memory 144) that maps normalized voltage rise levels to charger types.

In some embodiments, the processor of the method 400 may not calculate an estimation of a charge time if the voltage of the battery pack 120 is above a certain threshold (e.g., first threshold). Rather, for example, the processor (e.g., the processor 260 or 142) of the method 400 provides a default estimate (e.g., less than ten minutes) when the battery pack 120 detects that the voltage across the cells 230 is above the first threshold (e.g., in place of steps 420-460). In some embodiments, the processor of the method 400 may not estimate a charge time if the voltage of the battery pack 120 is below a certain threshold.

In some embodiments of the method 400, for example, the battery pack 120 may include noise filters to remove any noise introduced by an attached charger. For example, the charger 292 may induce periodic current pulses in the battery pack 120. The processor 260 of the battery pack 120 may use a running average of the current and voltage measurements to filter out current pulses. In some embodiments of the method 400, for example, the battery pack 120 may be disconnected from the charger 292 for short periods of time. The processor 260 of the battery pack 120 may ignore short periods of disconnection in order to estimate the charge time in method 400.

In some embodiments of the method 400, for example, the battery pack 120 may be disconnected from the mobile application 145. The mobile application 145 may run a timer upon disconnection and provide an estimate of charge time based on the last charge time estimation (e.g., generated by the method 400) before disconnection. The mobile application 145 may then resume charge time estimation using the method 400 upon reconnecting with the battery pack 120.

Figure 7:
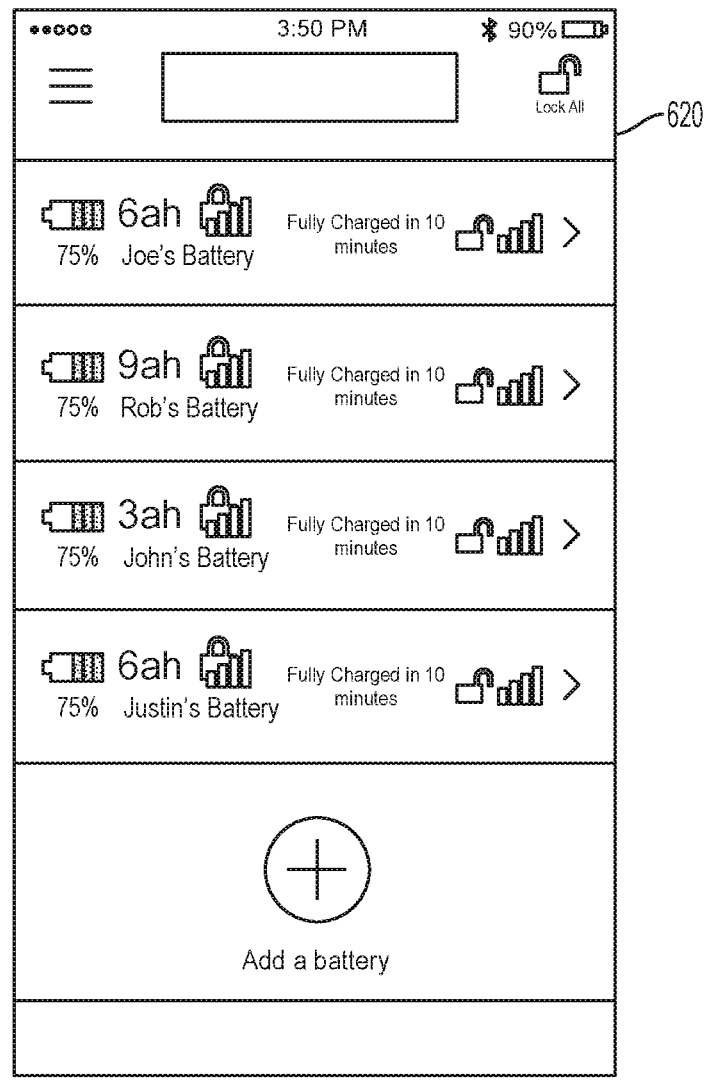
FIG. 7 illustrates another user interface of an application in accordance with some embodiments.

In some embodiments of the method 400, for example, the mobile application 145 may receive estimation of charge time information from multiple battery packs. For example, the multiple battery packs may execute the method 400 and output the estimation of charge time to the mobile application 145 via the communication network 220. Additionally or alternatively, the mobile application 145 may receive voltage information (via the processor 142 in step 410) from each of the multiple battery packs via the communication network 220, and the processor 142 may execute the remaining steps of the method 400 to generate estimates of time to full charge for each battery pack. The mobile application 145 may display the charge time for multiple battery packs on a user interface of the mobile device 140. An example of a user interface 620 of the mobile device 140 displaying charge time for multiple batteries is illustrated in FIG. 7.

The battery pack 120 may include a reverse locator button. When the button is pressed, the battery pack 120 sends a notification to the mobile application 145. The mobile application 145 causes the mobile device to generate an audible, visual, and/or tactile notification. The user is able to locate the mobile device 140 upon hearing, seeing, and/or feeling the notification from the mobile device 140.

In some embodiments, the power tool 110 communicates a unique power tool identifier associated with the power tool 110 to the battery pack 120. The battery pack 120 then communicates the unique power tool identifier to the mobile application 145. The mobile application 145 may determine the power tool based on the unique power tool identifier and display an image corresponding to the power tool 110 on the user interface of the mobile application 145. The mobile application 145 may also access a server (for example, a manufacturer's server) and pull up certain information regarding the power tool 110. The mobile application 145 may determine whether the user registered the power tool 110 with the manufacturer. The mobile application 145 may also determine the warranty period, number of days remaining in the warranty, and the like for the power tool 110. The mobile application 145 may also determine whether the power tool 110 is under a lifetime service agreement with the manufacturer.

In some embodiments, the battery pack 120 communicates a unique battery pack identifier to the mobile application 145. The mobile application 145 may determine the battery pack based on the unique battery pack identifier and display an image corresponding to the battery pack 120 on the user interface of the mobile application 145. The mobile application 145 may also access a server (for example, the server 135, which may be a manufacturer's server) and retrieve and display certain information regarding the battery pack 120. The mobile application 145 may determine whether the user registered the battery pack 120 with the manufacturer. The mobile application 145 may also determine the warranty period, number of days remaining in the warranty, and the like for the battery pack 120. The mobile application 145 may also determine whether the battery pack 120 is under a lifetime service agreement with the manufacturer.

In some embodiments, the mobile application 145 notifies the user whether the battery pack 120 is in-use or idle in response to communications from the battery pack 120. The mobile application 145 may periodically receive a signal from the battery pack 120 (e.g., from the processor 260 via the communication network 220) indicating whether the battery pack 120 is in-use. The battery pack 120 may indicate that the battery pack is in-use when the current sensor 240 detects that a current is flowing through the cells 230 and may indicate that the battery pack 120 is not in-use when the current sensor 240 detects no current. For example, the processor 260 may compare a detected current level detected by the current sensor 240 to an in-use current threshold. When the processor determines that the detected current level is above the in-use current threshold, the processor 260 determines that current is flowing through the cells 230 and that the battery pack is in-use. When the processor 260 determines that the detected current level is below the in-use current threshold, the processor 260 determines that no current (or a negligible amount of leakage current) is flowing through the cells 230. The mobile application 145 may also display whether the power tool 110 is in-use or idle. For example, in addition to the signal indicating whether the battery pack 120 is in-use, the battery pack 120 sends the unique power tool identifier of the power tool 110. Based on the signal and the unique power tool identifier, the mobile application 145 may display the power tool 110 with an indication of whether the tool is in-use or idle, as the case may be. The communication between the battery pack 120 and the mobile application 145 is performed in real time. The mobile application 145, therefore, indicates that the battery pack 120 and/or power tool 110 is in-use (or idle) in real time when the mobile application 145 receives the corresponding signal from the battery pack 120.

Figures 8, 9:
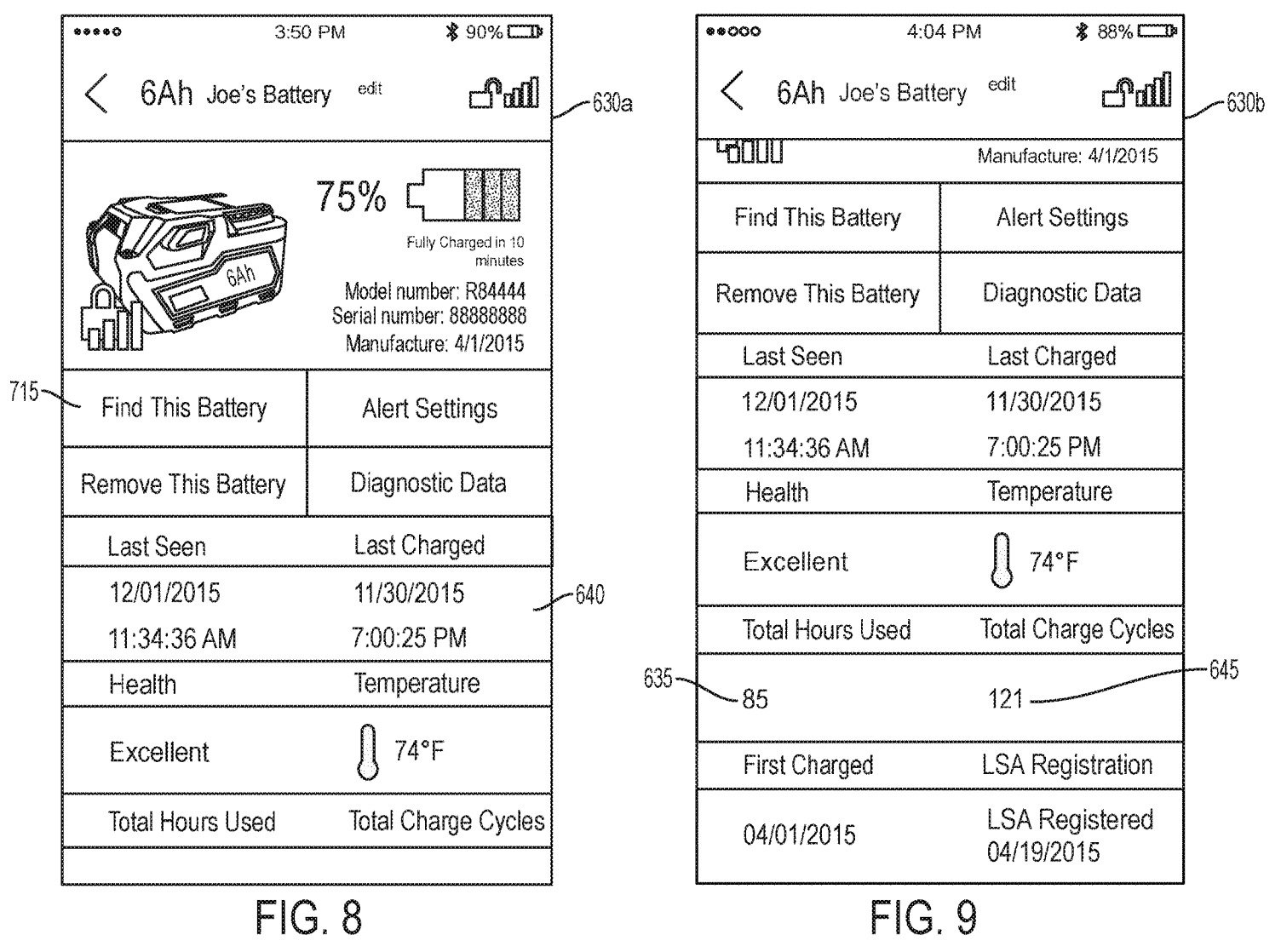

In some embodiments, the mobile application 145 may display the number of hours a battery pack 120 has been used. The battery pack 120, similar to the process described in FIG. 3, may track the amount of time a trigger of a power tool is pulled. For example, the processor 260 may use a counter that is incremented during periods of time when the trigger 112 is pulled and cease incrementing the counter when the trigger 112 is released. The battery pack 120 may store this information in the memory 270 and upload it to the mobile application 145 or to a server over the network 130. The mobile application 145 displays the number of hours that the battery pack 120 has been used. For example, FIGS. 8 and 9 illustrate a user interface at two different scroll positions, labeled as user interfaces 630a and 630b, and the user interface 630b includes an indicator 635 of the number of hours used.

In some embodiments, the mobile application 145 may also receive a signal indicating the last time the battery pack 120 was charged. The user interfaces 630a and 630b of FIGS. 8 and 9 illustrate an example of a user interface of the mobile application 145 displaying the last time the battery pack 120 was charged using a last-time charged indicator 640. The battery pack 120 may determine that cells 230 are being charged based on a change in the voltage across the cells 230 detected by the voltage sensor 250. The battery pack 120 then communicates a signal indicating that the battery pack 120 is being charged to a server of the network 130 or to the mobile application 145. The server or the mobile application 145 may determine the time (and/or date) the signal was received and display the time on the user interface of the mobile application 145. The mobile application 145 may also display the number of hours the battery pack 120 has been used since last charged based on the charging signal received from the battery pack 120 and tracked time of use information received from the battery pack 120.

In some embodiments, the mobile application 145 may display the total recharges (e.g., total charge cycles) of the battery pack 120. The user interface 630b of FIG. 9 illustrates an example of a user interface of the mobile application 145 displaying the total recharges using a total recharges indicator 645. The battery pack 120 may send a signal indicating that the battery pack is charged after every charge cycle. The battery pack 120 may count and store the number of times the battery pack 120 is charged in the memory 270. The battery pack 120 may communicate the total recharges based on these signals to a server (e.g., the server 135) through the network 130 or to the mobile application 145.

In some embodiments, the mobile application 145 may provide recommendations to a user on which tools (such as power tool 110) matchup with particular battery packs (such as battery pack 120). A server (e.g., an application server such as the server 135) may store information regarding the compatibility (i.e., matchup) of power tools and battery packs. For example, the matchups may be stored in a look up table in a memory of the server. The mobile application 145 may look up the matchups based on the unique power tool identifier or unique battery pack identifier received to provide recommendations. For example, in response to identifying a particular battery pack (e.g., of a particular capacity) based on a battery ID received from the battery pack 120 over the wireless communication network 125 or user input on a user interface, the mobile application 145 may provide the battery ID to the server to access the look up table, which provides in response a list of one or more recommended tools to use with the battery pack. The mobile application 145 then displays the list of one or more recommended tools. Additionally, in response to identifying a particular tool based on a unique tool ID or a user input on a user interface, the mobile application 145 may provide the unique tool ID to the server to access the look up table, which provides in response a list of one or more recommended battery packs (e.g., of a particular capacity) to use with the particular tool. The mobile application 145 then displays the list of one or more recommended battery packs. As an example, a high capacity battery pack may be suggested for a first tool with a first, high current demand, while a low capacity or high capacity battery pack may be suggested for a second tool with a second, low current demand that is lower than the first, high current demand. A high capacity battery pack may have a first capacity that is greater than a second capacity of a low capacity battery pack. In some embodiments, the mobile application 145 may also provide a recommendation upon detecting that the mobile application 145 is in a certain location. In some embodiments, the mobile application 145 displays the matchups in response to receiving an input requesting to show the compatibility of the power tool 110 and/or the battery pack 120. In some embodiments, the mobile application 145 determines the particular power tool 110, battery pack 120, or both based on comparing a received current trace to the current trace repository, as described above, rather than based on user selection or receipt of a unique tool ID or battery ID.

In some embodiments, the mobile application 145 may alert a user that the battery pack 120 is in a low charge state. The battery pack 120 communicates a signal when the voltage sensor 250 detects that the voltage across the cells 230 is below a predetermined low charge threshold (e.g., 20% of capacity). The mobile application 145 may display an alert in response to receiving a low charge signal from the battery pack 120. The mobile application 145 may also recommend that the battery pack 120 be charged. In some embodiment, the mobile application 145 may also alert a user that the battery pack 120 is in deep discharge state. FIG. 10 illustrates a user interface 660, which is an example of a user interface of the mobile application 145 displaying a deep discharge alert 665. The battery pack 120 may communicate a signal when the voltage sensor 250 determines that the voltage across the cells 230 is below a predetermined deep discharge threshold. A deep discharge threshold is a voltage below which the battery pack 120 may be damaged (for example, 5% of capacity). The mobile application 145 may display the alert 665 in response to this signal received from the battery pack 120.

In some embodiments, the mobile application 145 may display an overcurrent protection alert. FIG. 11 illustrates a user interface 670, which is an example of a user interface of the mobile application 145 displaying an overcurrent protection alert 675. The battery pack 120 may communicate a signal when the current sensor 240 determines that the current through the cells 230 exceeds a predetermined threshold. The predetermined threshold may be stored in the memory 270. The mobile application 145 may display the alert 675 in response to receiving this signal from the battery pack 120.

In some embodiments, the temperature sensor 280 may detect a temperature of the cells 230. In some embodiments, the temperature sensor 280 may also detect an ambient temperature. The battery pack 120 may communicate a signal upon determining that the temperature detected by the temperature sensor 280 exceeds a first predetermined temperature or is below a second predetermined temperature. The mobile application 145 displays an alert notifying a user of the storage conditions (for example, Hot/Cold battery storage alert) based on the received signal. FIG. 12 illustrates a user interface 680, which is an example of a user interface of the mobile application 145 displaying a hot battery alert 685.

Figure 13C:
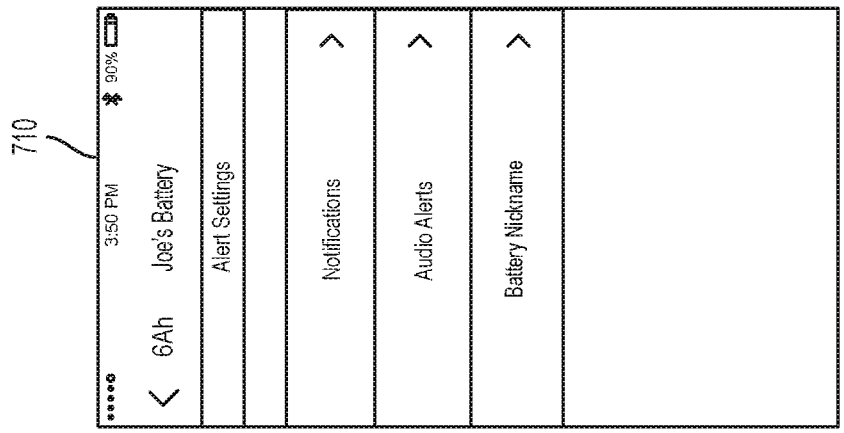
FIGS. 13A, 13B, and 13C illustrate screens of another user interface of an application in accordance with some embodiments.
Figure 13B:
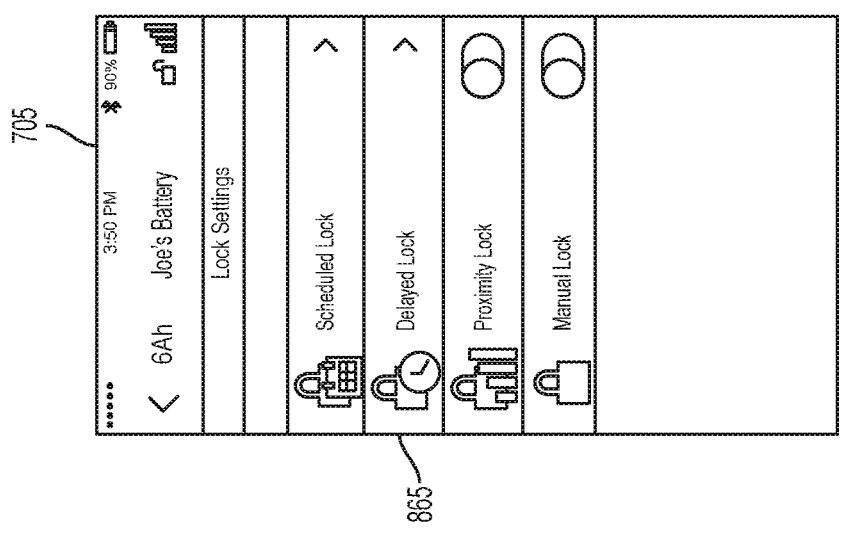
Figure 13A:
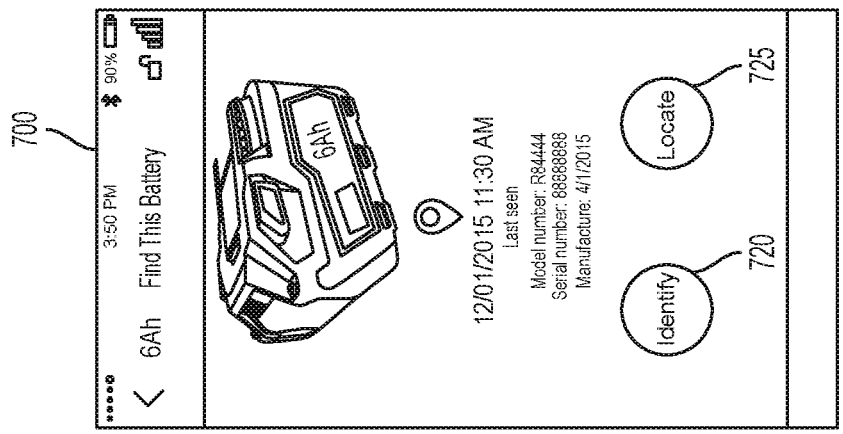

FIGS. 13A, 13B, and 13C illustrate multiple screens of a user interface of the mobile application 145, labeled as a user interface 700, user interface 705, and user interface 710, respectively. The user interface 700 is displayed on the mobile device 140 by the mobile application 145 in response to receiving a user selection of a find this battery key 715 on the user interface 630a of FIG. 8. On the user interface 700, an identify key 720 and a locate key 725 is provided. In response to receiving a user selection of the locate key 725, the mobile device 140 sends a communication to the battery pack 120 via the communication network 220 causing the processor 260 to generate an audible notification (for example, a beep or other sound via the speaker 285. In response to receiving a user selection of the identify key 720, the mobile device 140 sends a communication to the battery pack 120 via the communication network 220 causing the processor 260 to generate a visual notification (for example, a flash via an light emitting diode (LED) or fuel gauge on the battery pack 120). In some embodiments, selecting the identify key 720 or locate key 725 results in the mobile device 140 sending a communication to the battery pack 120 via the communication network 220 causing the processor 260 to generate a an audible and a visual notification.

The user interface 705 is displayed on the mobile device 140 by the mobile application 145. Via the user interface 705, various lock setting selections may be received from a user to lock (i.e., disable) the battery pack 120, such as at a particular date and time (e.g., Wednesday at 7:00), after a particular amount of time lapses (e.g., after 30 minutes or 5 hours), whenever the battery pack 120 is outside of a particular range (e.g., 20 or 30 feet) as determined by strength of signal of the communication network 220, or through direct command (e.g., to lock or unlock). The selected lock settings may be transmitted by the mobile device 140 to the battery pack 120, which carries out the requested lock setting.

The user interface 710 is displayed on the mobile device 140 by the mobile application 145. Via the user interface 705, various alert and other setting selections may be received from a user, such as specifying which notifications to be generated by the mobile application 145 on the mobile device, which audio alerts to be implemented by the battery pack 120, and which name the mobile application 145 should use to refer to the battery pack 120. One or more of the selected settings may be transmitted by the mobile device 140 to the battery pack 120 to configure the battery pack 120, and one or more of the selected settings may be saved by the mobile application 145 (e.g., on the memory 144) for use by the mobile application 145.

Figures 14A, 14B, 14C:
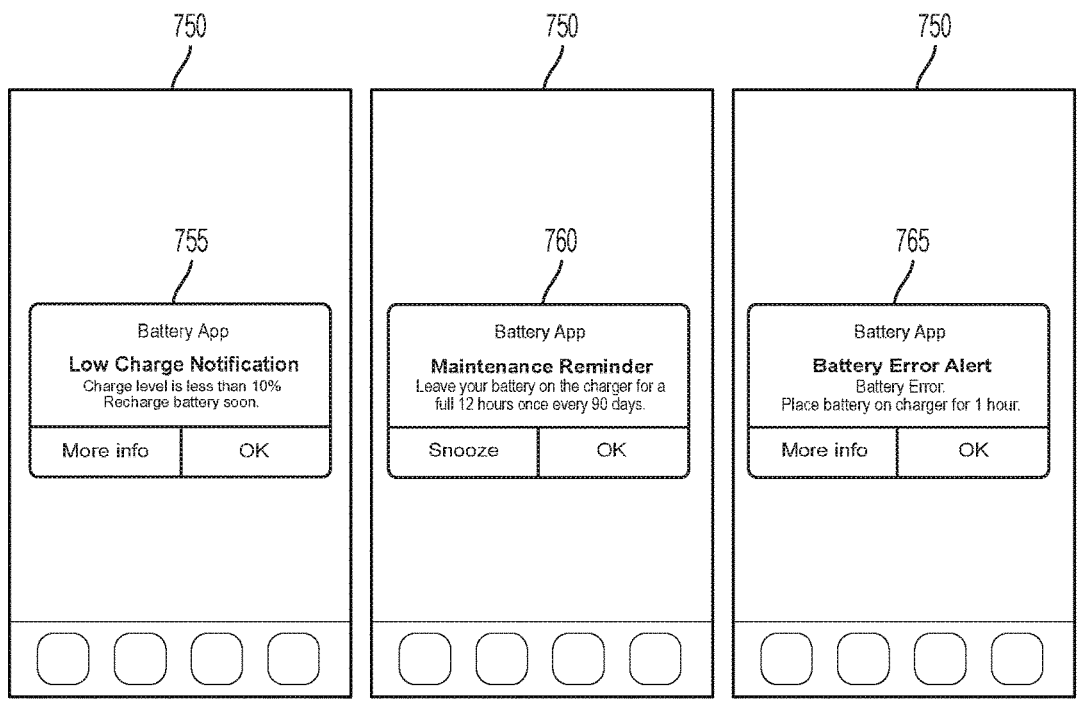
FIGS. 14A, 14B, 14C, 14D, and 14E illustrate another user interface of an application in accordance with some embodiments.
Figures 14D, 14E:
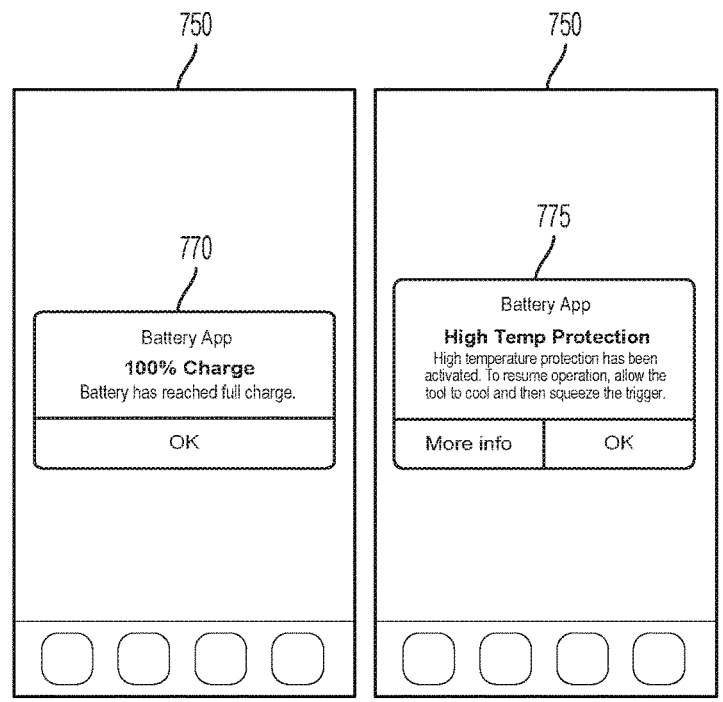

FIGS. 14A, 14B, 14C, 14D, and 14E illustrate screenshots of a user interface 750 of the mobile application 145 including various messages. FIG. 14A includes a low charge notification 755 to indicate to a user that the battery pack 120 has a low state of charge. FIG. 14B includes a maintenance reminder 760 to indicate to a user that the battery pack 120 has not been placed on a charger (e.g., the charger 292) for a certain number of uninterrupted hours (e.g., twelve hours) in over a certain number of days (e.g., ninety days). FIG. 14C includes a battery error alert 765 to indicate to a user that the battery pack 120 has had an error and should be placed on a charger (e.g., the charger 292) for a certain time period (e.g., one hour). FIG. 14D includes a full charge notification 770 to indicate to a user that the battery pack 120 has completed charging. FIG. 14E includes a high temperature protection notification 775 to indicate to a user that the battery pack 120 has reached a high temperature and has been temporarily disabled by the processor 260. The mobile application 145 may generate the various messages in the user interface 750 based on battery information (e.g., sensed current and voltage data and battery identification information) received from the battery pack 120 over the communication network 220, information received from the server 135, previously stored information in the memory 144, or a combination thereof.

Figure 15A:
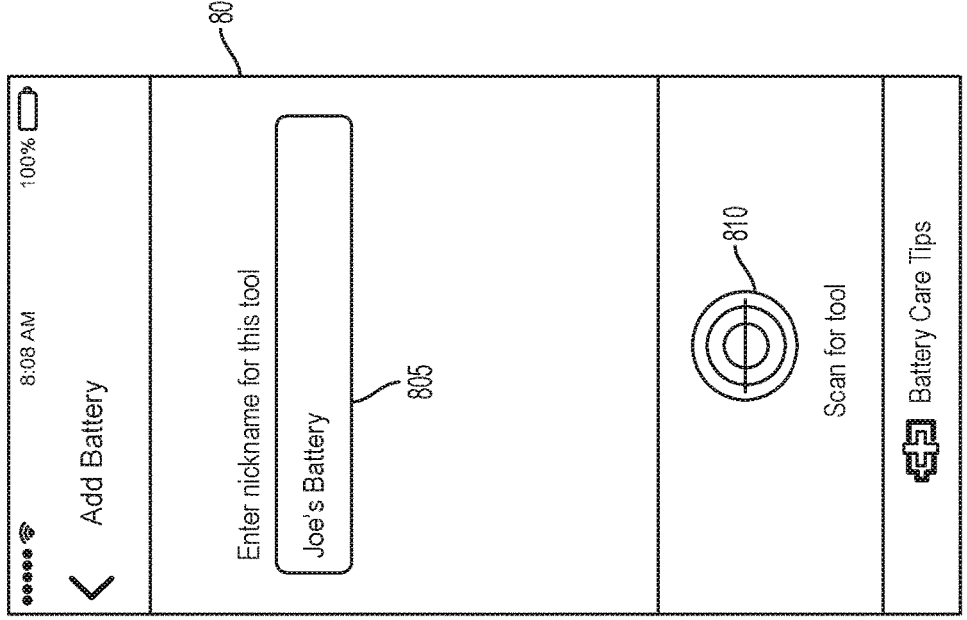
FIGS. 15A and 15B illustrate screens of another user interface of an application in accordance with some embodiments.
Figure 15B:
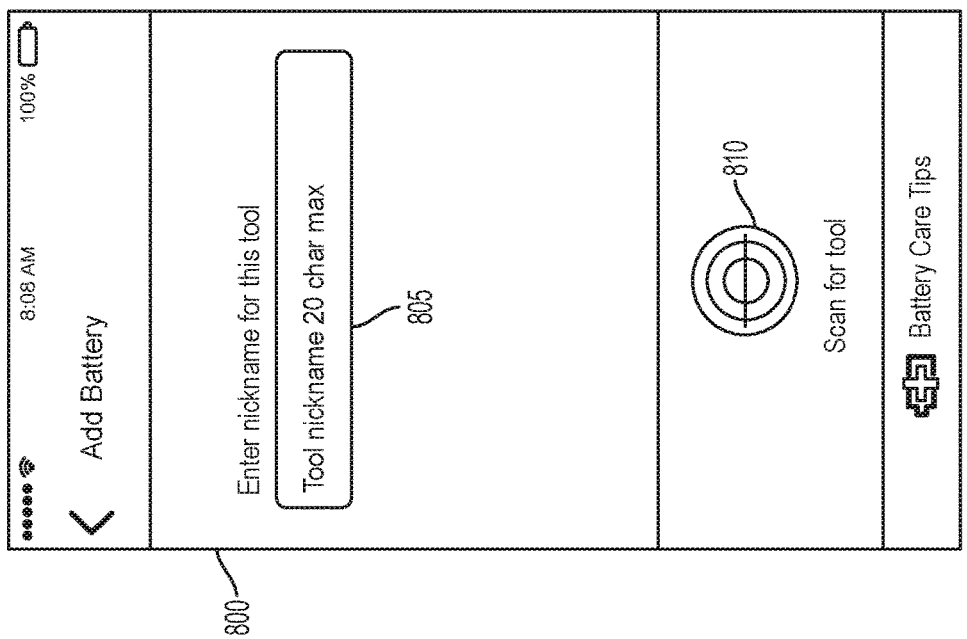

FIGS. 15A and 15B illustrate screens of a user interface 800 of the mobile application 145 enabling the mobile device 140 to receive user input via a text box 805 specifying a name for the battery pack 120 that the user desires the mobile application 145 to use in referring to the particular battery pack 120 (e.g., "Joe's Battery"). The user may also select a scan key 810 to cause the mobile device 140 to perform a wireless scan that can be used to create a wireless communication link (i.e., "pair") the mobile device 140 to the battery pack 120.

Figure 16B:
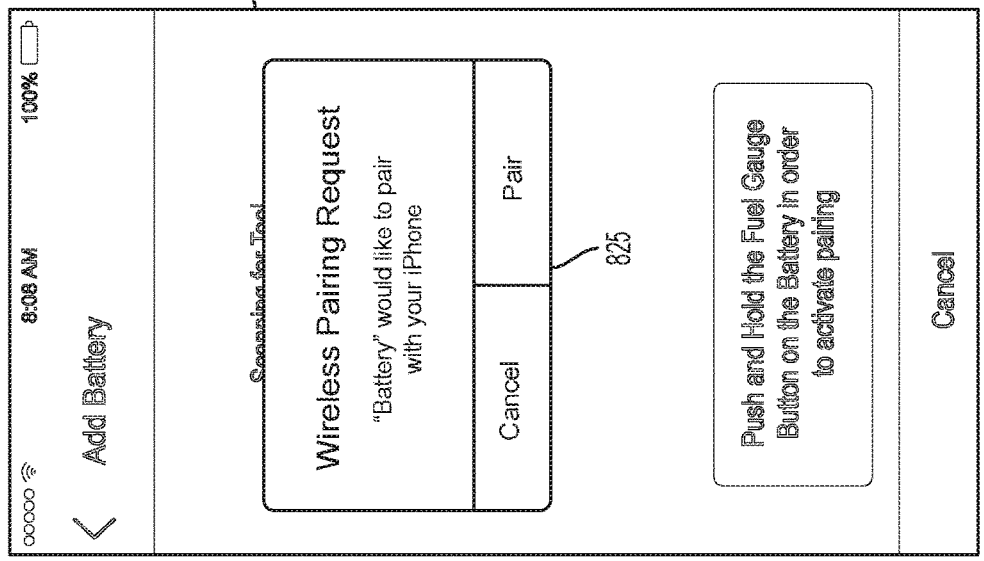
FIGS. 16A, 16B, and 17 illustrate additional user interfaces of an application in accordance with some embodiments.
Figure 16A:
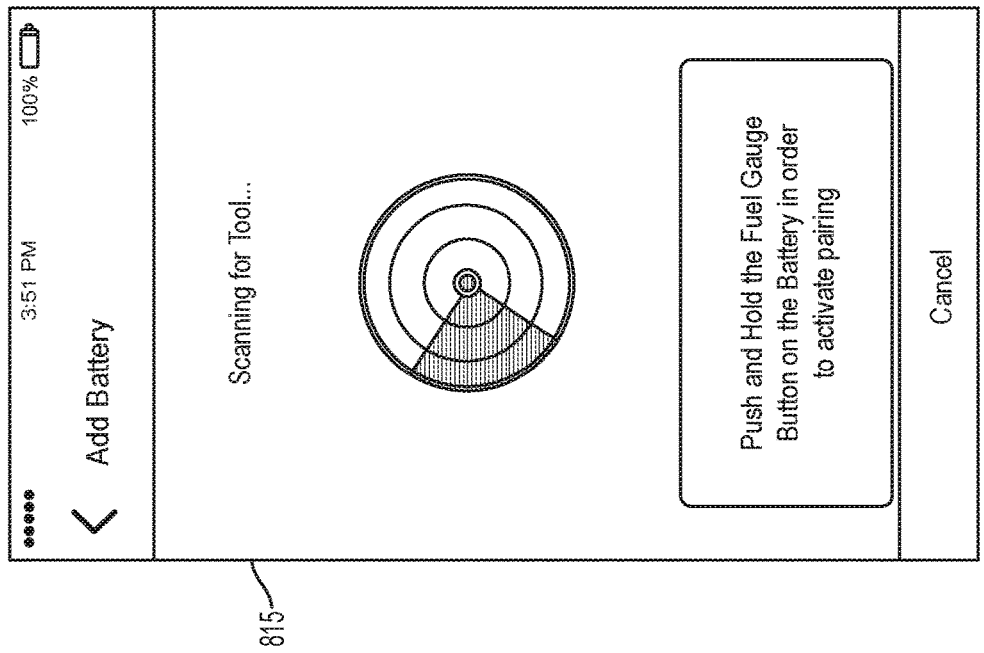
Figure 17:
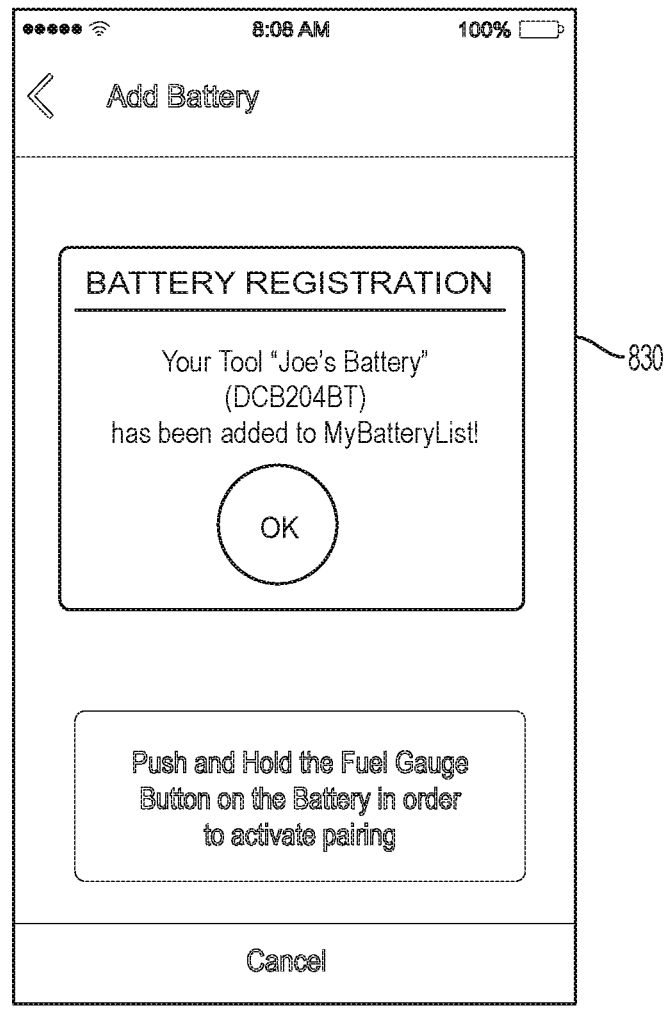

FIG. 16A illustrates a user interface 815 of the mobile application 145 when the scan resulting from selection of the scan key 810 is in progress, which provides an instruction to the user to press a button on the battery pack 120 to pair the mobile device 140 with the battery pack 120. In response to the processor 260 receiving an indication that the button on the battery pack 120 was pressed, the processor 260 sends a pairing request to the mobile device 140. FIG. 16B illustrates a user interface 820 of the mobile application 145 resulting from receipt of the pairing request, and prompting the user to accept the request by selection of a pair key 825. In response to receiving a selection of the pair key 825, the mobile device 140 establishes the wireless communication link (e.g., the communication network 220) with the battery pack 120, and associates the name entered via text box 805 with an identify of the battery pack 120 received during the pairing, and stores the association in a list of such associations in the memory 144, a memory of the server 135, or both. An indication of the pairing and association is provided in the user interface 830 of the mobile application 145 illustrated in FIG. 17.

Figure 18:
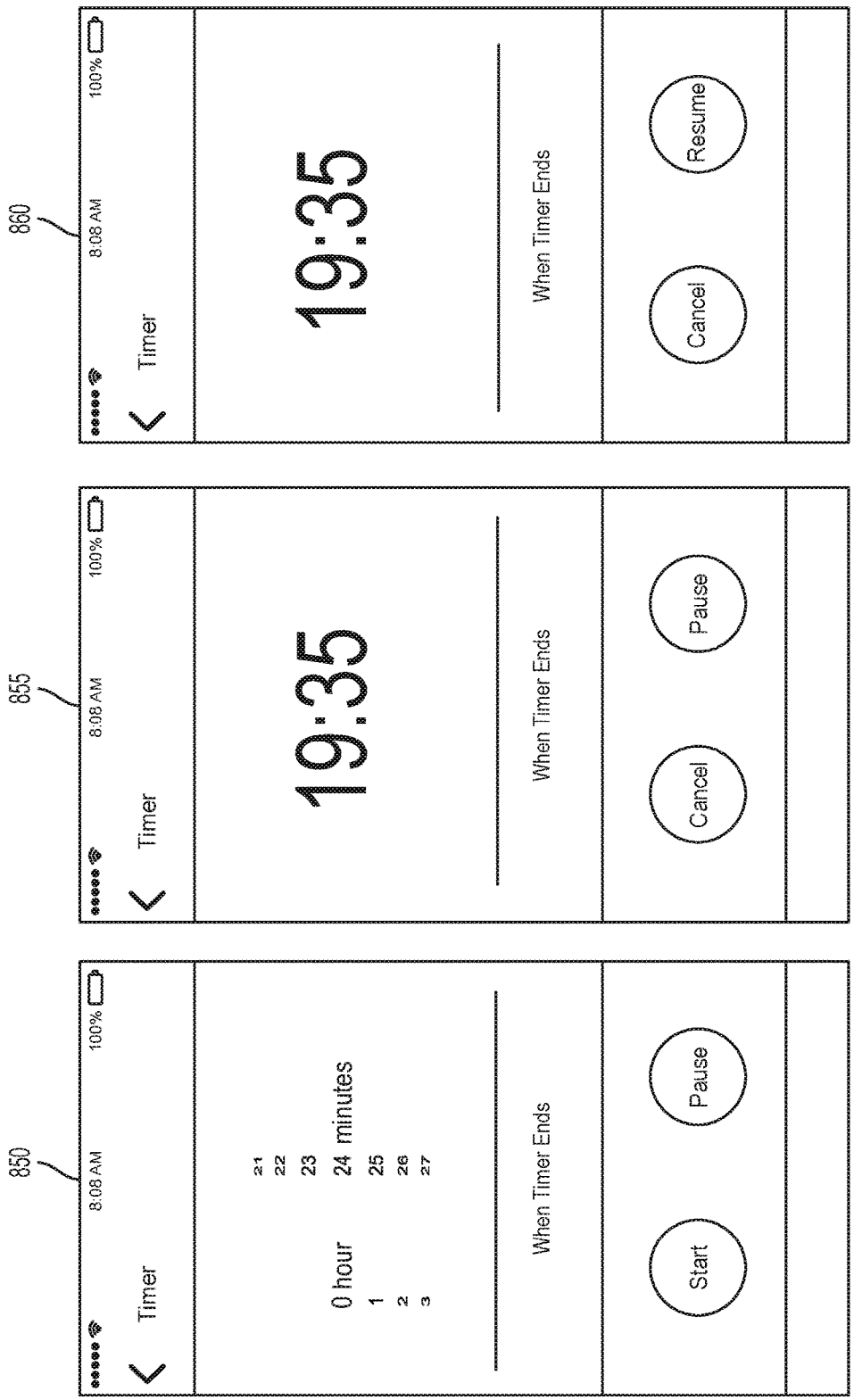
FIGS. 18A, 18B, and 18C illustrate additional user interfaces of an application in accordance with some embodiments.

FIGS. 18A, 18B, and 18C illustrate multiple screens of a user interface of the mobile application 145, labeled as a user interface 850, user interface 855, and user interface 860, respectively. The user interface 850 enables receipt of a user indication of a request time after which the battery pack 120 should be locked. The mobile application 145 may display the user interface 850 in response to selection of the delayed lock key 865 of FIG. 13B. The user interfaces 850 and 855 illustrate a time left until the lock of the battery pack 120 will occur, and enables pausing and resuming of the timer based on received user input via the interfaces.

The above described methods, embodiments, or functions are capable of being performed by one or more of the processor 260 of the battery pack 120, the mobile application 145 using the processor 142 of the mobile device 140, or an application server (e.g., the server 135) connected to the battery pack 120 and the mobile application 145. For example, unless otherwise noted, a function described as being performed by the battery pack 120 may be performed based on control actions executed by the processor 260. Similarly, unless otherwise noted, a function described as being performed by the mobile application 145 or mobile device 140 may be performed based on control actions executed by the processor 142.

Figure 19:
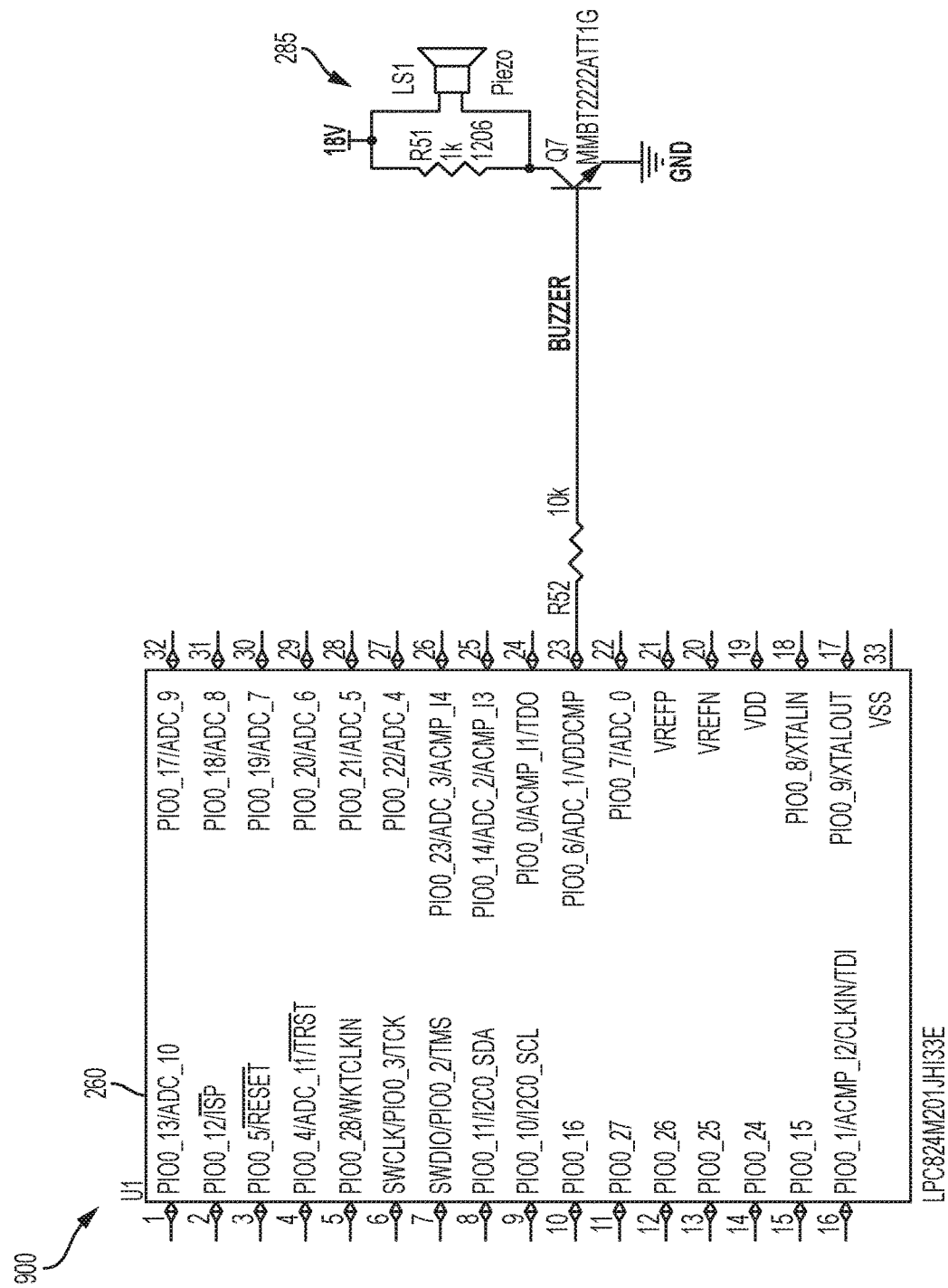
FIG. 19 illustrates an audio notification circuit used in a battery pack in accordance with some embodiments.

FIG. 19 illustrates an audio notification circuit 900 used in the battery pack 120. The audio notification circuit 900 includes the processor 260 connected to the speaker 185. The speaker 285 is capable of producing an audio output, for example, a buzz, a beep and the like. The particular arrangement and components of the audio notification circuit 900 are merely examples, as other processors, speakers, and connections between the components are used in some embodiments. Additionally, for illustration purposes, only the connection between the processor 260 and the speaker 285 are illustrated in FIG. 19, while, in practice, further connections (e.g., to the processor 260) and components are included in the battery pack 120.

The voltage sensor 250 may monitor a voltage across the cells 230 and provide an indication of the voltage to the processor 260. The processor 260 compares the voltage signal from the voltage sensor 250 to a first predetermined voltage indicating a charge complete status of the battery pack 120. When the processor 260 determines that the voltage measured by the voltage sensor 250 is equal or greater than the first predetermined voltage, the processor 260 sends a signal to the speaker 285 to produce the audio output. Thus, a user can be audibly notified upon the battery pack 120 completing charging.

In some embodiments, the processor 260 monitors a lock state of the battery pack 120. The mobile application 145 is capable of receiving an input from a user to lock the battery pack 120 and transmitting a lock command in accordance with the received input to the battery pack 120, as described with respect to FIGS. 13B and 18A-18C. When the battery pack 120 is locked, the battery pack 120 is disabled and does not provide electric power to the power tool 110 connected to the battery pack 120. When a user tries to access the battery pack 120 that is in a lock state (e.g., by pulling the trigger 112), the processor 260 causes the speaker 285 to produce an audio output. In some embodiments, the battery pack 120 may include a button that locks the battery pack 120 when pressed. Thus, a user can be audibly notified upon attempting to use the battery pack 120 when in a locked state.

In some embodiments, the processor 260 compares the voltage signal from the voltage sensor 250 to a second predetermined voltage indicating a low charge state. When the processor 260 determines that the voltage measured by the voltage sensor 250 is equal to or below the second predetermined voltage, the processor 260 sends a signal to the speaker 285 to produce an audio output. In some embodiments, the processor 260 may use a similar comparison to cause an audio output notifying a user to charge the battery pack. Thus, a user can be audibly notified upon the battery pack 120 having a low charge.

In some embodiments, the processor 260 monitors a wireless connection, such as a Bluetooth® connection, of the battery pack 120. When the processor 260 determines that the battery pack 120 has lost the wireless connection, the processor 260 sends a signal to the speaker 285 to produce an audio output. In some embodiments, the processor 260 may also send the signal to the speaker 285 to produce an audio output when a wireless connection is established. The wireless connection being monitored may be, for example, the communication network 220 between the battery pack 120 and the mobile device 140. Thus, a user can be audibly notified upon the battery pack 120 pairing and disconnecting with the mobile device 140.

The speaker 285 may issue a different audio output for each of the above described notifications. For example, a low charge state may result in a single beep, while a full charge may result in two beeps.

Figure 20B:
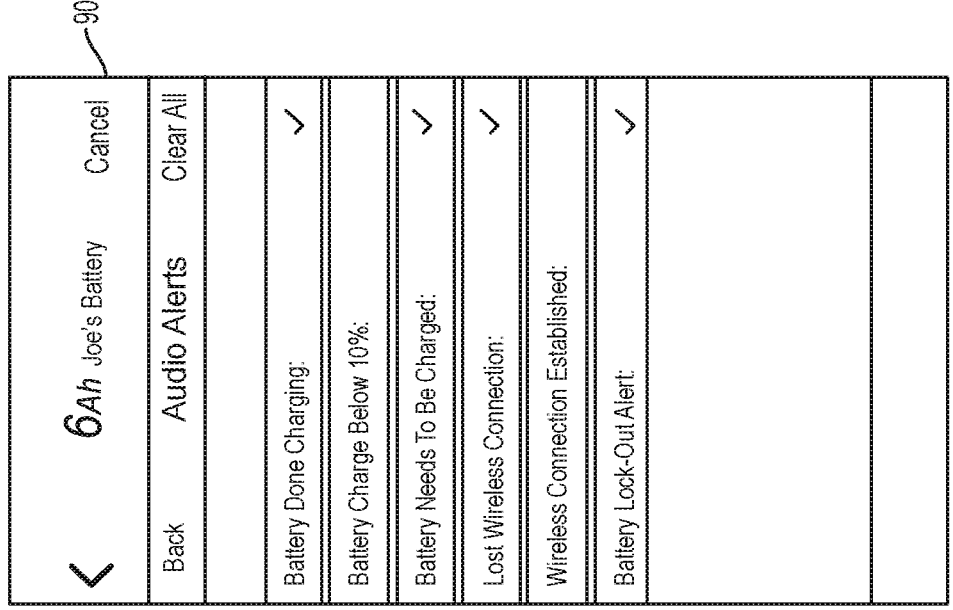
FIGS. 20A and 20B illustrate another user interface of a mobile application in accordance with some embodiments.
Figure 20A:
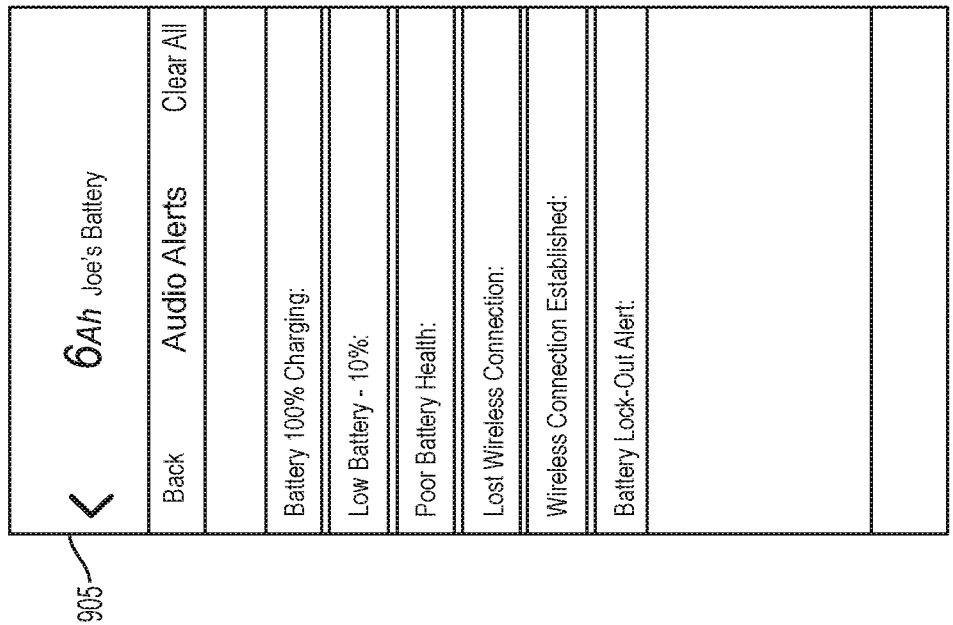

In some embodiments, the mobile application 145 is capable of receiving an input regarding which of the notifications are to be sent to the mobile application 145. FIGS. 20A and 20B illustrate screenshots of a user interface 905 of the mobile application 145 enabling the mobile device 140 to receive user input to select the conditions that will cause the processor 260 to generate audible alerts with the speaker 285. The alert settings are transmitted to the battery pack 120 via the communication network 220 and are stored in the memory 270 for use by the processor 260. The user interface 905 may be generated by the mobile application 145 in response to selection of the audio alerts key 910 (see FIG. 13C).

In some embodiments, the mobile application 145 includes further user interfaces that receive user input specifying tool parameters (for example, maximum motor speed and tool mode). The mobile application 145, in response to user input, communicates the tool parameters to the battery pack 120 over the communication network 220. The processor 260 of the battery pack 120 receives the tool parameters and communicates the tool parameters to the controller 210 of the power tool 110 over the wired connection (e.g., the dedicated communication terminals) of the battery pack 120 and the power tool 110. The tool parameters are stored in a memory of the controller 210, in addition to or overwriting previous parameters. The controller 210 then controls the power tool 110 in accordance with the received tool parameters. For example, the controller 210 may provide control signals to drive the motor of the power tool 110 in accordance with a tool mode indicated by the received tool parameters or such that the maximum speed indicated by the received tool parameters is not exceeded.

Figure 21:
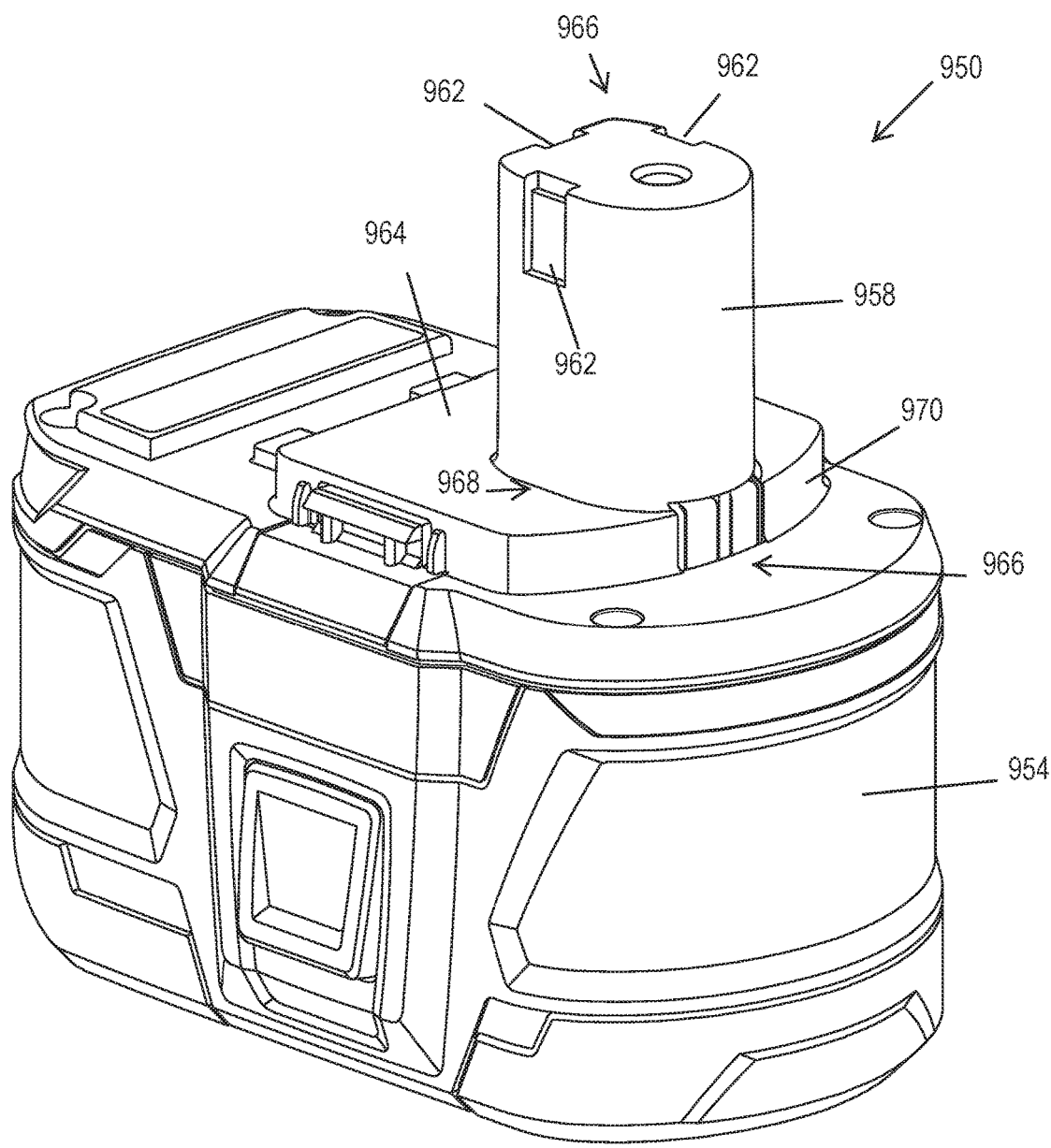
FIG. 21 illustrate a battery pack in accordance with another with some embodiments.
Figure 22:
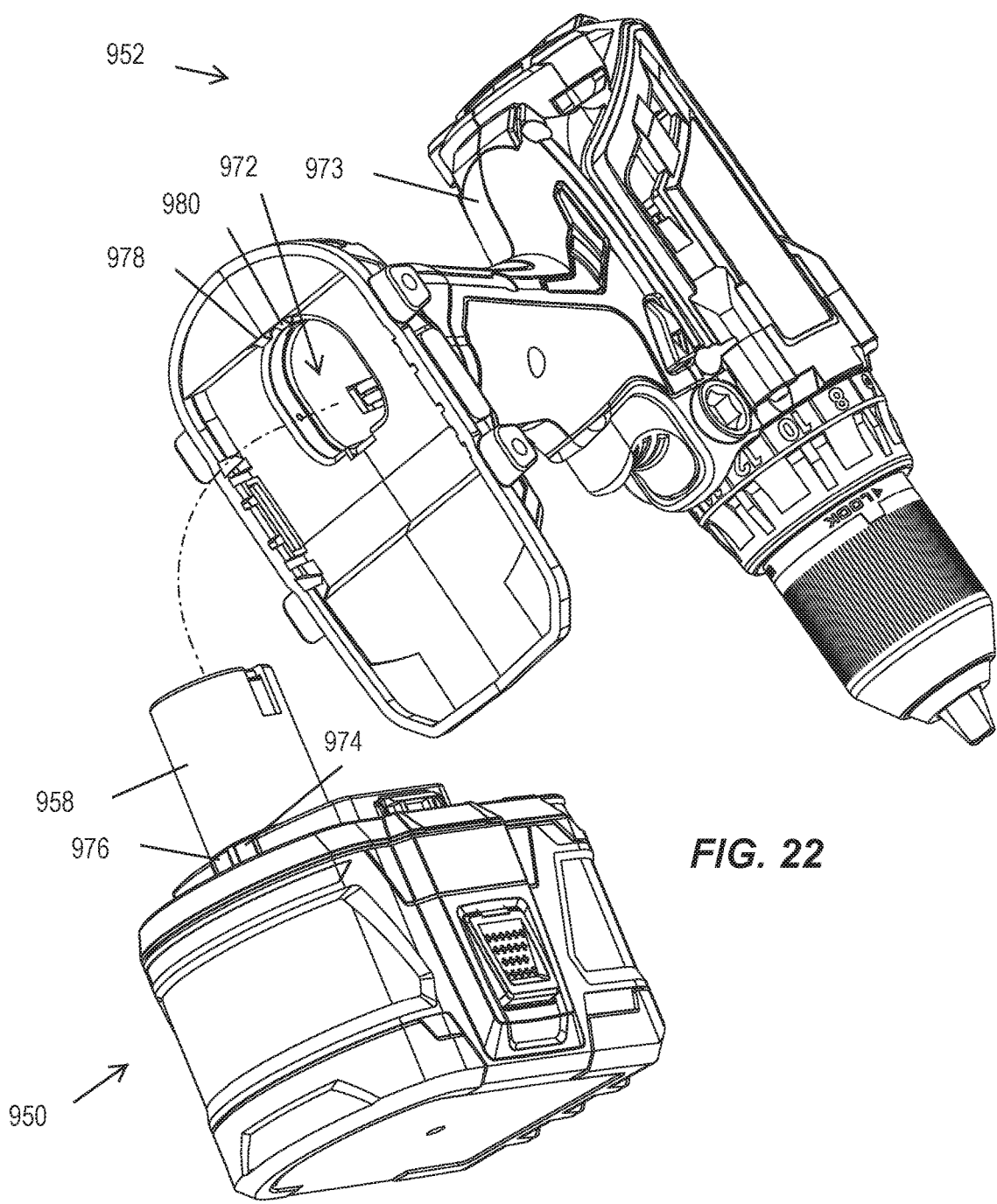
FIG. 22 illustrates a power tool and the battery pack of FIG. 21 in accordance with another with some embodiments.

FIGS. 21 and 22 illustrate another embodiment of the battery pack 120, referred to as battery pack 950. The battery pack 950 functions similarly to the battery pack 120, but the housing has a tower-style connector for coupling to a power tool 952, while the battery pack 120 is a slide-on connector for coupling to the power tool 110. The power tool 952 is similar to the power tool 110 except for accepting of tower-style battery packs (e.g., the battery pack 952), rather than slide on battery packs. Accordingly, but for the different connections styles and location of terminals, the description of the battery pack 120 above applies to the battery pack 950, and vice-versa, and the description of the power tool 110 above applies to the power tool 952, and vice-versa.

The battery pack 950 includes a housing 954 having a base 956 and a tower 958 projecting from the base 956. The tower 958 includes a dedicated terminal for communicating with the power tool 952. In particular, the tower 958 includes communication terminal 960. The battery pack 950 further includes separate power terminals 962 on three sides of the tower 958. The power tool 952 includes reciprocal power terminals and communication terminals that engage the power terminals 962 and communication terminal 960, respectively. Power for powering components of the power tool 952 (e.g., the controller 210 and motor) is provided from the battery pack 950 to the power tool 952 via power terminals 962. Communications between the power tool 952 and the battery pack 950 occur over the communication terminals 960. The communication terminals 960 are dedicated for communication and do not supply power to the controller 210 or motor of the power tool 952.

The tower 958 includes a platform portion 964 from which a stem portion 966 extends. The platform portion 964 and the stem portion 966 connect at an interface 968. The platform portion 964 further includes a front wall 970. With reference to FIG. 22, the stem portion 966 is received within a recess 972 of a housing 973 of the power tool 952. The communication terminal 960 includes a first contact 974 and second contact 976, which mate with a third contact 978 and fourth contact 980 of the power tool 952

In other constructions, the communication terminals 960 and power terminals 962 may be positioned in other locations on a battery pack. For example, in the case of the battery pack 120, the communication terminals 960 and the power terminals 962 may be positioned on the tool interface 124 (FIG. 1).

Various features and advantages of some embodiments are set forth in the following claims.

I claim:

1. A method for charge time generation for a battery pack configured to be attached to a power tool, the method comprising:
   detecting, by a processor, a voltage across a plurality of cells of the battery pack using a voltage sensor;
   converting, by the processor, the voltage across the plurality of cells to a state of charge;
   determining, by the processor, a bulk charge rate of a charger charging the battery pack;
   calculating, by the processor, a scalar conversion factor based on a ratio of the bulk charge rate of the charger and a capacity of the battery pack; and
   generating, by the processor, a time to full charge of the battery pack based on the state of charge and the scalar conversion factor.

2. The method of claim 1, wherein the processor is included in the battery pack and is configured to communicate with a mobile application on a mobile device over a wireless communication network, the method further comprising:
   outputting the time to full charge to the mobile application; and
   displaying, on the mobile device, the time to full charge.

3. The method of claim 1, wherein determining, by the processor, the bulk charge rate of the charger comprises:
   receiving, via a user interface of a mobile application, a selection of a charger type of the charger from a plurality of charger types, wherein the plurality of charger types are associated with a plurality of charge rates.

4. The method of claim 1, further comprising:
   detecting, by the processor, that a trigger of the power tool is activated;
   detecting, by the processor, a current output of the plurality of cells of the battery pack;
   storing, in a memory of the battery pack by the processor, the current output as a current trace; and
   continuing to store the current output as the current trace until the trigger is released.

5. The method of claim 4, further comprising:
   determining, by the processor, whether the current output deviates from an expected current output stored in the memory; and
   generating, by the processor, an alert in response to the processor determining that the current output deviates from the expected current output.

6. The method of claim 1, further comprising:
   comparing the voltage across the plurality of cells to a first predetermined voltage indicating a charge complete status of the battery pack; and
   when the voltage is equal to or greater than the first predetermined voltage, sending a signal to a speaker of the battery pack to produce an audio output.

7. The method of claim 1, wherein the battery pack is configured to communicate with a mobile application on a mobile device over a wireless communication network, the method further comprising:
   detecting an activation of a reverse locator button on the battery pack; and
   sending a notification to the mobile application based on detecting the activation of the reverse locator button.

8. The method of claim 1, wherein the battery pack is configured to communicate with a mobile application on a mobile device over a wireless communication network, the method further comprising:
   detecting, by a current sensor connected to the plurality of cells, that a current is flowing through the plurality of cells;
   sending, by the processor, a first signal indicating that the battery pack is in-use to the mobile application;
   displaying, on a user interface of the mobile application, a first indication that the battery pack is in-use;
   detecting, by the current sensor, that no current is flowing through the plurality of cells;
   sending, by the processor, a second signal indicating that the battery pack is idle to the mobile application; and
   displaying, on the user interface, a second indication that the battery pack is idle.

9. A battery pack system including a battery pack configured to be attached to a power tool, the battery pack system comprising;
   a plurality of cells of the battery pack;
   a voltage sensor of the battery pack connected to the plurality of cells; and
   a processor in communication with the voltage sensor and a memory and configured to:
      detect, by the processor, a voltage across the plurality of cells using the voltage sensor;
      convert the voltage across the plurality of cells to a state of charge;

determine a bulk charge rate of a charger charging the battery pack;
determine a scalar conversion factor based on the charge rate based on a ratio of the bulk charge rate of the charger and a capacity of the battery pack; and
generate a time to full charge of the battery pack based on the state of charge and the scalar conversion factor.

10. The battery pack system of claim 9, wherein the memory stores a look-up table having a mapping between a plurality of state of charge values and a plurality of voltage ranges and wherein the processor is configured to convert the voltage across the plurality of cells to the state of charge using the look-up table.

11. The battery pack system of claim 9, further comprising:
a temperature sensor; and
wherein the processor is coupled to the temperature sensor and is further configured to:
determine, based on the temperature sensor output, a temperature of the plurality of cells;
determine whether the temperature is within a predetermined temperature range; and
when the temperature is outside of the predetermined temperature range, suspend generation of the time to full charge.

12. The battery pack system of claim 9, wherein, to determine the bulk charge rate of the charger, the processor is configured to determine a charger type, which is associated with the bulk charge rate, and, to determine the charger type, the processor is configured to:
record an initial voltage of the plurality of cells;
record a second voltage of the plurality of cells at a predetermined time period after recording the initial voltage; and
determine a normalized voltage rise based on the initial voltage, the second voltage, and a normalization factor of the battery pack.

13. The battery pack system of claim 9, further comprising:
a current sensor connected to the plurality of cells; and
wherein the processor is coupled to the current sensor and is further configured to:
detect that a trigger of the power tool is activated;
detect, by the current sensor, a current output of the plurality of cells;
store, in the memory, the current output until the trigger is released to form a current trace;
determine whether the current output deviates from an expected current output stored in the memory; and
in response to the determining that the current output deviates from the expected current output, generate an alert.

14. The battery pack system of claim 9, further comprising:
a speaker included in the battery pack; and
wherein the processor is coupled to the speaker and is further configured to:
compare the voltage across the plurality of cells to a first predetermined voltage indicating a charge complete status of the battery pack; and
when the voltage is equal to or greater than the first predetermined voltage, send a signal to the speaker to produce an audio output.

15. A method for charge time generation for a battery pack configured to be attached to a power tool, the method comprising:

detecting, by a processor, a voltage across a plurality of cells of the battery pack using a voltage sensor;
converting, by the processor, the voltage across the plurality of cells to a state of charge;
determining, by the processor, a charge rate of the charger charging the battery pack, wherein determining the charge rate of the charger includes
receiving, via a user interface of a mobile application, a selection of a charger type of a charger charging the battery pack from a plurality of charger types, wherein the plurality of charger types are associated with a plurality of charge rates;
determining, by the processor, a conversion factor based on the charge rate; and
generating, by the processor, a time to full charge of the battery pack based on the state of charge and the conversion factor.

16. A method for charge time generation for a battery pack configured to be attached to a power tool, the method comprising:
detecting, by a processor, a voltage across a plurality of cells of the battery pack using a voltage sensor;
converting, by the processor, the voltage across the plurality of cells to a state of charge;
determining, by the processor, a charge rate of a charger charging the battery pack;
determining, by the processor, a conversion factor based on the charge rate;
generating, by the processor, a time to full charge of the battery pack based on the state of charge and the conversion factor;
detecting, by the processor, that a trigger of the power tool is activated;
detecting, by the processor, a current output of the plurality of cells of the battery pack;
storing, in a memory of the battery pack by the processor, the current output as a current trace; and
continuing to store the current output as the current trace until the trigger is released.

17. A method for charge time generation for a battery pack configured to be attached to a power tool, the method comprising:
detecting, by a processor, a voltage across a plurality of cells of the battery pack using a voltage sensor;
converting, by the processor, the voltage across the plurality of cells to a state of charge;
determining, by the processor, a charge rate of a charger charging the battery pack;
determining, by the processor, a conversion factor based on the charge rate;
generating, by the processor, a time to full charge of the battery pack based on the state of charge and the conversion factor, wherein the battery pack is configured to communicate with a mobile application on a mobile device over a wireless communication network;
detecting an activation of a reverse locator button on the battery pack; and
sending a notification to the mobile application based on detecting the activation of the reverse locator button.

18. A method for charge time generation for a battery pack configured to be attached to a power tool, the method comprising:
detecting, by a processor, a voltage across a plurality of cells of the battery pack using a voltage sensor;
converting, by the processor, the voltage across the plurality of cells to a state of charge;

determining, by the processor, a charge rate of a charger charging the battery pack;

determining, by the processor, a conversion factor based on the charge rate;

generating, by the processor, a time to full charge of the battery pack based on the state of charge and the conversion factor, wherein the battery pack is configured to communicate with a mobile application on a mobile device over a wireless communication network;

detecting, by a current sensor connected to the plurality of cells, that a current is flowing through the plurality of cells;

sending, by the processor, a first signal indicating that the battery pack is in-use to the mobile application;

displaying, on a user interface of the mobile application, a first indication that the battery pack is in-use;

detecting, by the current sensor, that no current is flowing through the plurality of cells;

sending, by the processor, a second signal indicating that the battery pack is idle to the mobile application; and displaying, on the user interface, a second indication that the battery pack is idle.

19. A battery pack system including a battery pack configured to be attached to a power tool, the battery pack system comprising;

a plurality of cells of the battery pack;

a voltage sensor of the battery pack connected to the plurality of cells;

a current sensor connected to the plurality of cells; and a processor in communication with the voltage sensor, the current sensor and a memory and configured to:

detect, by the processor, a voltage across the plurality of cells using the voltage sensor;

convert the voltage across the plurality of cells to a state of charge;

determine a charger type of a charger charging the battery pack, the charger type associated with a charge rate;

determine the charge rate by
recording an initial voltage of the plurality of cells,
recording a second voltage of the plurality of cells at a predetermined time period after recording the initial voltage, and
determining a normalized voltage rise based on the initial voltage, the second voltage, and a normalization factor of the battery pack;

determine a conversion factor based on the charge rate based on the charge rate; and generate a time to full charge of the battery pack based on the state of charge and the conversion factor.

20. A battery pack system including a battery pack configured to be attached to a power tool, the battery pack system comprising;

a plurality of cells of the battery pack;

a voltage sensor of the battery pack connected to the plurality of cells;

a current sensor connected to the plurality of cells; and a processor in communication with the voltage sensor and a memory and configured to:

detect, by the processor, a voltage across the plurality of cells using the voltage sensor;

convert the voltage across the plurality of cells to a state of charge;

determine a charge rate of a charger charging the battery pack;

determine a conversion factor based on the charge rate based on the charge rate;

generate a time to full charge of the battery pack based on the state of charge and the conversion factor;

detect that a trigger of the power tool is activated;

detect, by the current sensor, a current output of the plurality of cells;

store, in the memory, the current output until the trigger is released to form a current trace;

determine whether the current output deviates from an expected current output stored in the memory; and in response to the determining that the current output deviates from the expected current output, generate an alert.

\* \* \* \* \*